United States Patent [19]

Eaton et al.

[11] Patent Number: 4,835,855

[45] Date of Patent: Jun. 6, 1989

[54] METHOD AND APPARATUS FOR CRIMPING

[75] Inventors: Homer L. Eaton, Leucadia; Kenneth G. Selesky, San Juan Capistrano; Goro Kambara, Valley Center, all of Calif.

[73] Assignee: MTS Systems Corporation, Eden Prairie, Minn.

[21] Appl. No.: 67,552

[22] Filed: Jun. 29, 1987

[51] Int. Cl.[4] .............................................. H01R 43/04
[52] U.S. Cl. ....................................... 29/863; 29/861; 29/748; 29/753
[58] Field of Search .............. 29/857, 861, 863, 33 M, 29/748, 753, 759

[56] References Cited

U.S. PATENT DOCUMENTS

| | | | |
|---|---|---|---|
| 2,545,756 | 5/1962 | Andren | 153/1 |
| 3,056,446 | 10/1962 | Schmidt et al. | 153/1 |
| 3,086,574 | 4/1963 | Ustin | 153/1 |
| 3,150,762 | 9/1964 | Tricinci | 198/33 |
| 3,235,125 | 2/1966 | Sonntag | 221/299 |
| 3,402,452 | 9/1968 | Mraz | 29/203 |
| 3,456,324 | 7/1969 | Hahn et al. | 29/203 |
| 3,460,230 | 8/1969 | Moulin | 29/203 |
| 3,537,167 | 11/1970 | Lawson | 29/203 |
| 3,664,173 | 5/1972 | Haucke et al. | 72/424 |
| 3,710,483 | 1/1973 | Morgan et al. | 29/203 P |
| 3,733,883 | 5/1973 | Kaczmarek | 72/420 |
| 4,031,613 | 6/1977 | Brown et al. | 29/753 |
| 4,178,679 | 12/1979 | Lichtenstein | 29/715 |
| 4,232,443 | 11/1980 | Lichtenstein et al. | 29/760 |
| 4,443,936 | 4/1984 | Lazaro, Jr. | 29/753 |
| 4,576,032 | 3/1986 | Maack et al. | 72/465 |

Primary Examiner—P. W. Echols
Assistant Examiner—Taylor J. Ross
Attorney, Agent, or Firm—Gausewitz, Carr & Rothenberg

[57] ABSTRACT

Automatic crimping apparatus for crimping contacts of different sizes on electrical wires is positioned at the side of a conveyor that moves successive wires to and from alignment with a crimping station which includes a shaker bowl furnishing contacts to a sender station. The sender station sends the contacts one at a time via a pneumatic line through a hollow chuck and collet to seat the barrel end of the contact end upon a contact locating seat that is precisely positioned within a cam operated multi-pin crimper. The contact end receiving seat is apertured and recessed in one end of a funnel assembly and locating structure having a wire receiving and guiding funnel at the other end to define a wire guide path in alignment with the apertured contact end receiving seat. With a contact end positioned on the receiving seat, a portion of the wire receiving barrel of the contact is in the operative region of the crimper, with the other end being firmly grasped in the collet. The assembly is moved toward the conveyor to cause a wire laterally positioned on the conveyor to be guided through the funnel and through the apertured receiving seat into the contact barrel for crimping of the contact on the wire. The two separable parts of the contact receiving seat and funnel assembly are then separated, withdrawn from the crimper and the assembly is retracted from the conveyor to withdraw the wire and crimped contact from the crimping station. A pin probe is provided to test proper orientation and roundness of the contact end on the receiving seat, and at an adjacent station the conveyor presents the wire and its crimped contact for a contact pull test.

46 Claims, 11 Drawing Sheets

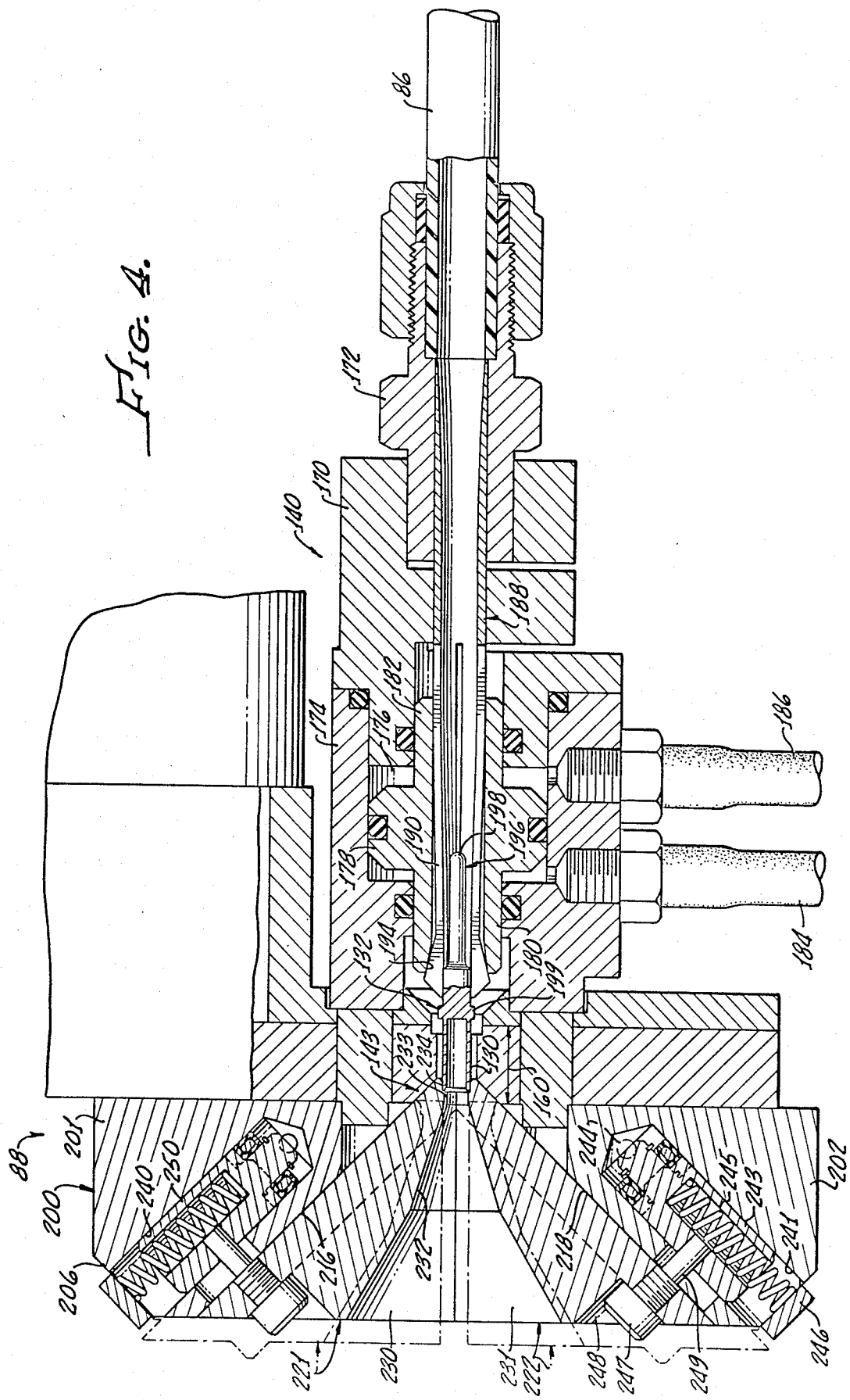

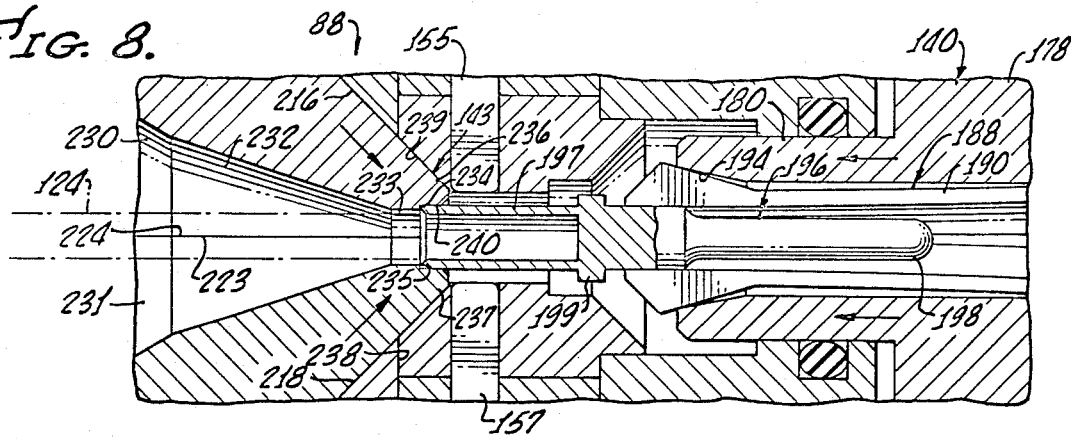
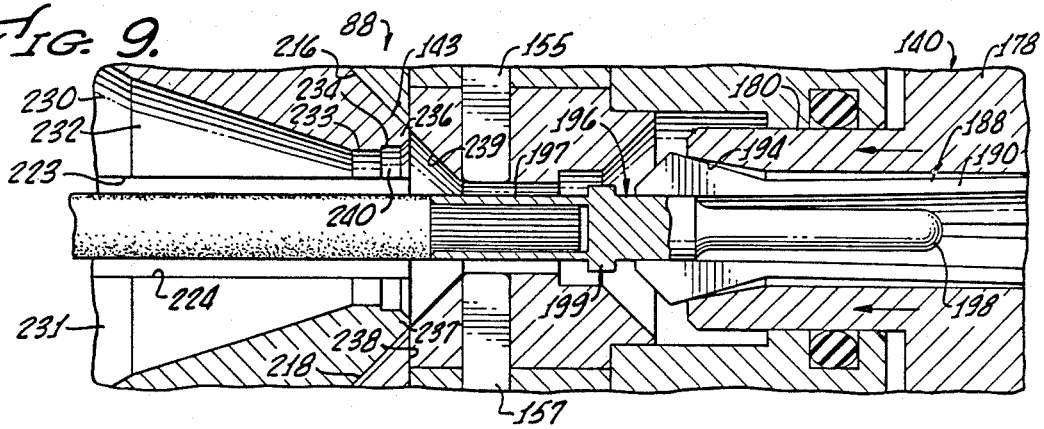
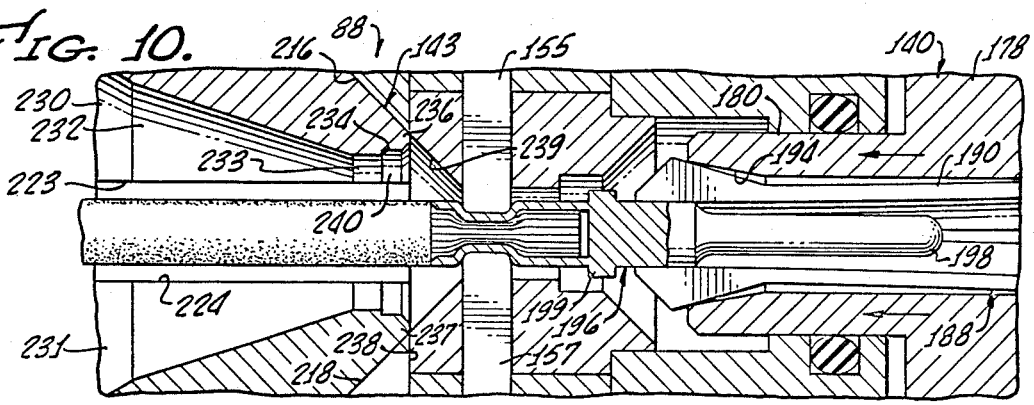
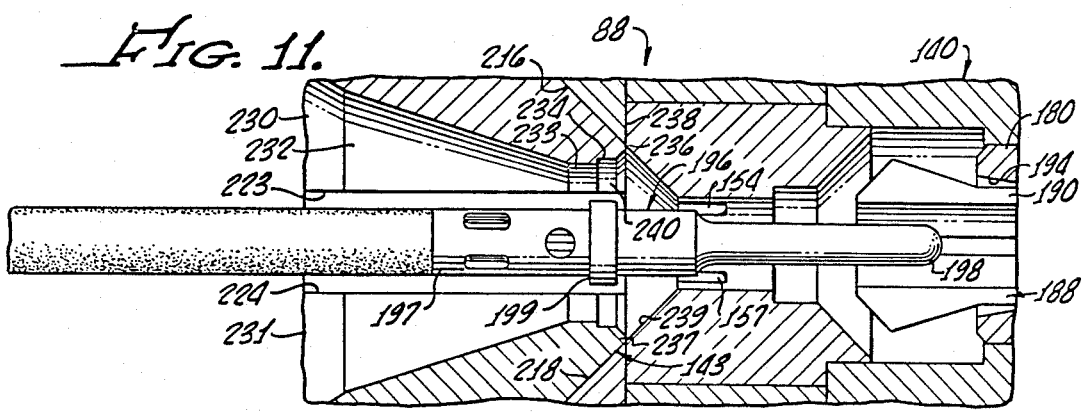

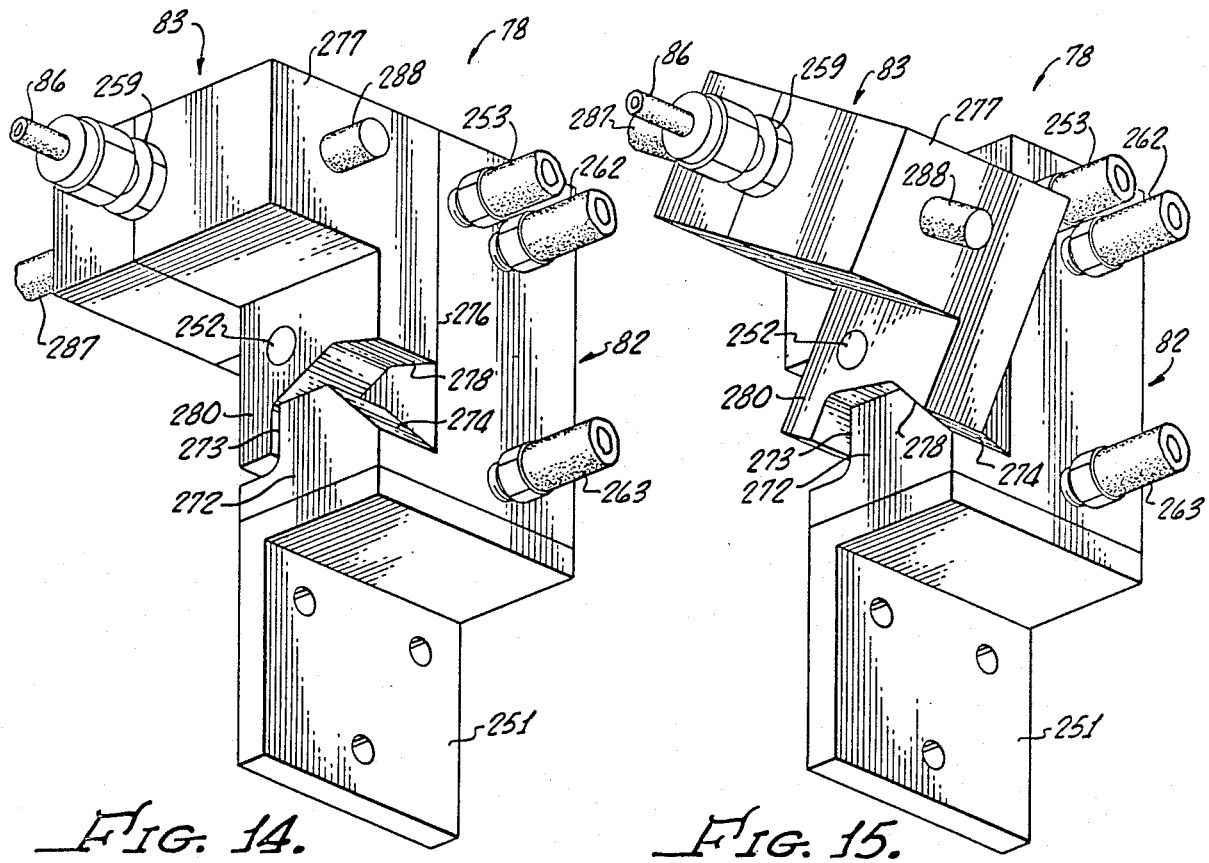
FIG. 14.
FIG. 15.
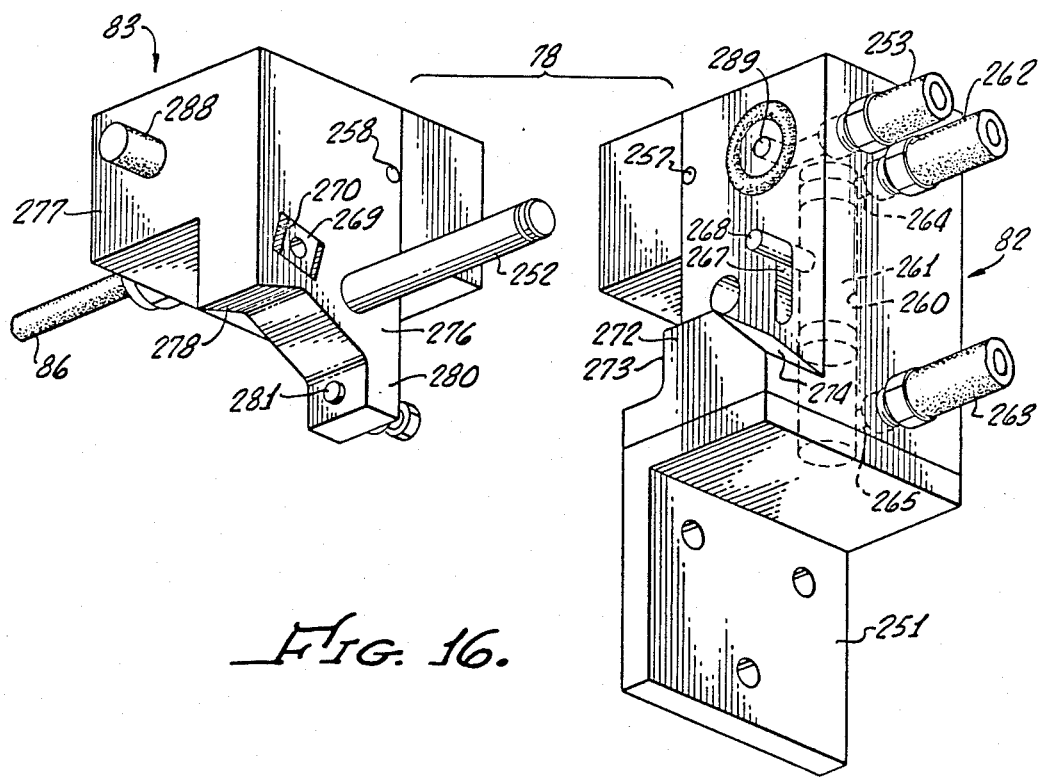
FIG. 16.

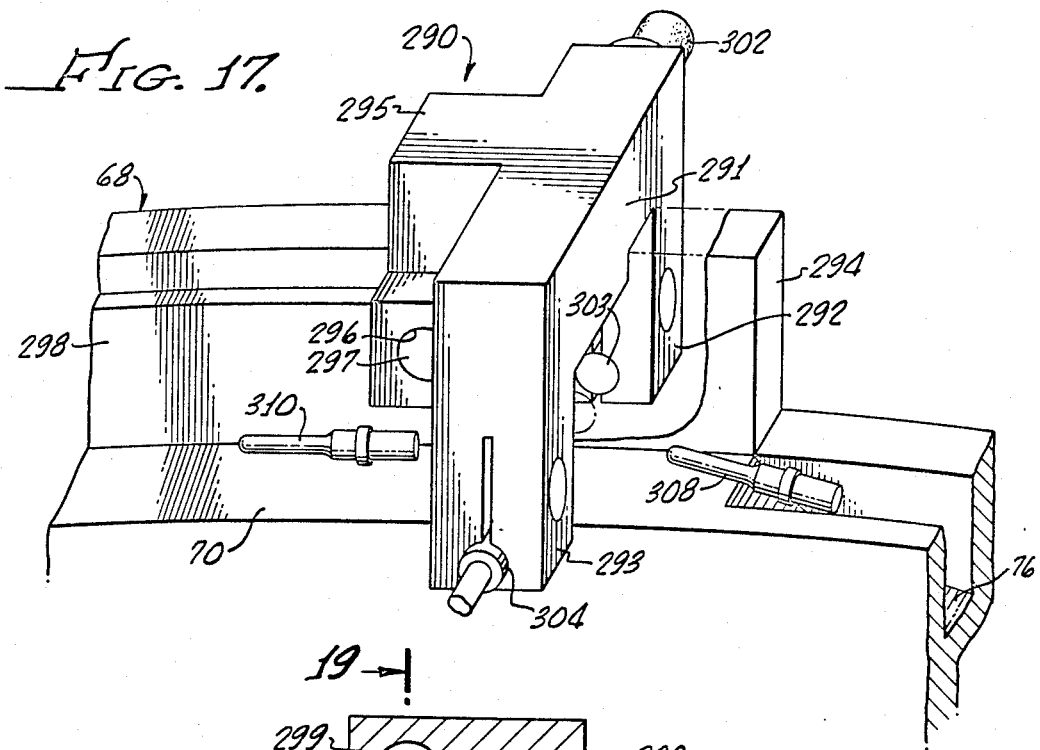
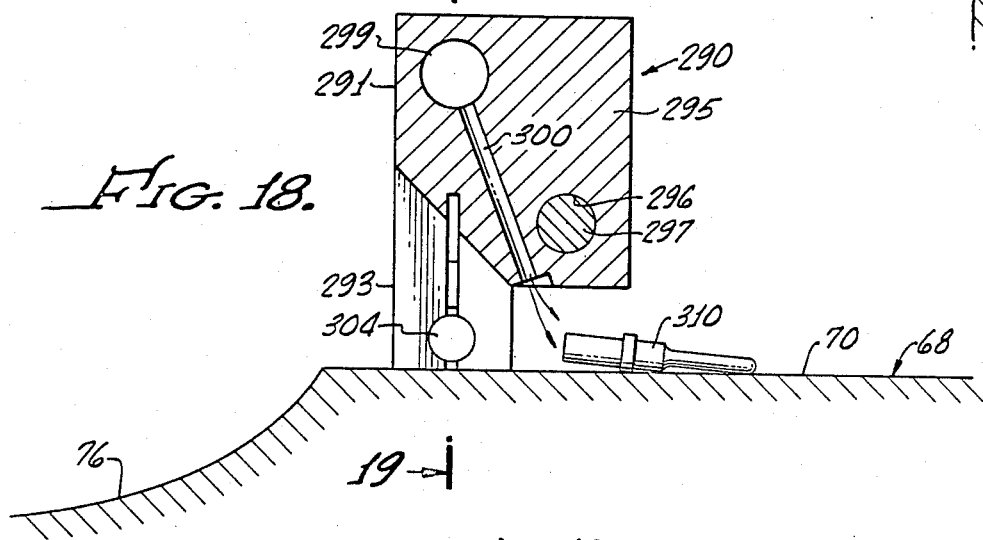
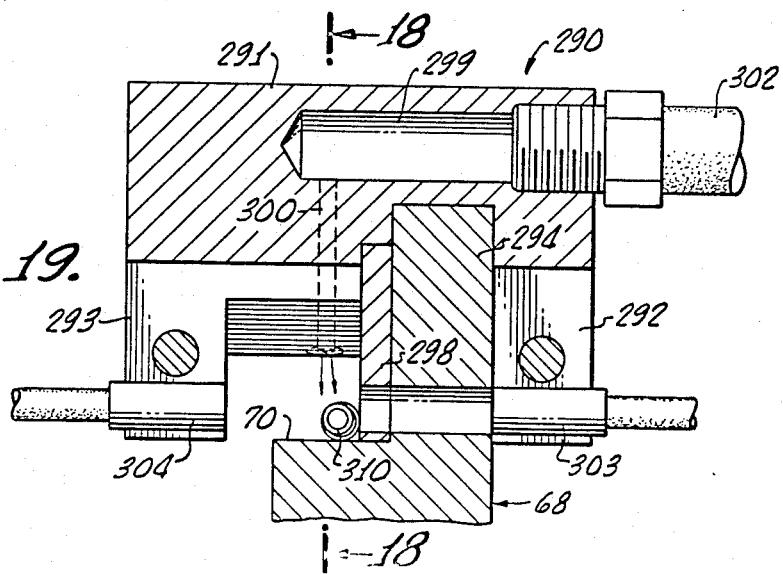

4,835,855

METHOD AND APPARATUS FOR CRIMPING

BACKGROUND OF THE INVENTION

Systems have been developed for automatic wire preparation and handling and wherein a number of wires are cut to length, stripped, furnished with crimped contacts and have at least one end thereof inserted into a multi-wire, high density connector. For such automatic wire handling systems it is necessary to provide crimping apparatus capable of accommodating different size wires and contacts, and capable of rapidly and automatically crimping the contacts upon the wires. For example, in the co-pending application for Method and Apparatus for Wire Processing of Homer Eaton, Ser. No. 615,933, Filed May 31, 1984, assigned to the assignee of the present application, there is shown a wire processing apparatus in which wire is withdrawn from a supply spool, measured, marked, cut to a selected length, wound upon a small reel with both ends of the wire protruding from the reel, grasped at its protruding ends in a pair of clamps mounted on a continuous conveyor, moved past end finishing stations, such as stripping and crimping stations on either side of the conveyor, and unloaded from the conveyor as a finished length of wire wound upon its own individual reel with both ends having selected contacts crimped thereto and protruding from the reel.

Existing wire crimping apparatus for applying contacts require large amounts of space, and thus make it difficult, if not impossible, to provide for selectively attaching contacts of a plurality of different sizes to successive wires of different sizes that may be carried one after the other by the conveyor. Moreover, prior crimpers are neither sufficiently fast nor sufficiently precise in positioning of the contact to accommodate the high speed wire processing available with the above-described equipment.

Accordingly, it is an object of the present invention to provide improved methods and apparatus for crimping contacts upon wire ends in such a fashion as to avoid or minimize above-mentioned problems.

SUMMARY OF THE INVENTION

In carrying out principles of the present invention, in accordance with a presently preferred embodiment thereof, wire crimping apparatus includes crimping means having a crimping region for receiving a contact to be attached to a wire end and for cromping a contact at the crimping region. A funnel assembly includes a contact end locator having an end locator member positioned at a selected distance from and on one side of the crimping region and also provides a wire guiding path leading to the contact end locator member. A contact is fed through a collet and through the crimping region into abutment with the end locator member, and a wire end is fed along the wire guiding path to be received in the barrel of a contact positioned at the locator member, whereby the contact may be precisely positioned on the wire end and crimped in place.

According to another feature of the invention, contacts are fed one at a time to the contact end locator via a positioning and securing collet which repetitively grasps and releases the contact while the latter is urged into abutment with the end locator, thereby to precisely aline and position the contact at the locator, both transversely and longitudinally.

The contact end locator includes a recessed seat that is part of a funnel assembly made of relatively displaceable parts so that when the parts are together they form an apertured stop that receives and precisely positions the end of a contact fed to one side of the funnel assembly and allows the wire to be fed into the contact from the other side. When the funnel assembly parts are displaced from one another the wire with the contact crimped thereon may by withdrawn through the aperture of the contact end locator and along the wire guide path.

The method and apparatus also include a sending station that receives contacts from a feeder device and sends them, one at a time, to the funnel assembly. According to another feature, the feeder device is provided with a separator that controls the rate of feeding contacts to the sender station. Testing of the contacts before and after attachment to a wire end is also provided.

BRIEF DESCRIPTION OF THE DRAWINGS

FIG. 3 illustrates a test probe.

FIG. 4 is a longitudinal sectional view showing the assembly of contact holding and positioning chuck, crimping arm, and funnel assembly.

FIG. 8 illustrates a contact seated in the contact end locator of the funnel assembly and held by the chuck.

FIG. 9 illustrates insertion of an end of a stripped wire into the contact barrel.

FIG. 10 illustrates the crimping action.

FIG. 11 illustrates retraction of the carriage to withdraw the wire with the crimped contact through the contact end locator and funnel assembly.

FIGS. 14 and 15 are pictorial views of the sender unit in receiving and sending positions, respectively.

FIG. 16 is an exploded pictorial view of the sending unit components, with the pivot block turned to shown an inner face thereof.

FIG. 17 is a pictorial illustration of a contcat separator.

FIG. 18 is a longitudinal section of the contact separator, taken on lines 18—18 of FIG. 19.

FIG. 19 is a section of the contact separator mounted on a feeder bowl rim and taken on lines 19—19 of FIG. 18.

DETAILED DESCRIPTION

The term "wire" is employed herein to include single and multi-strand electrical conductors and also includes optical fibers.

Figure 1:
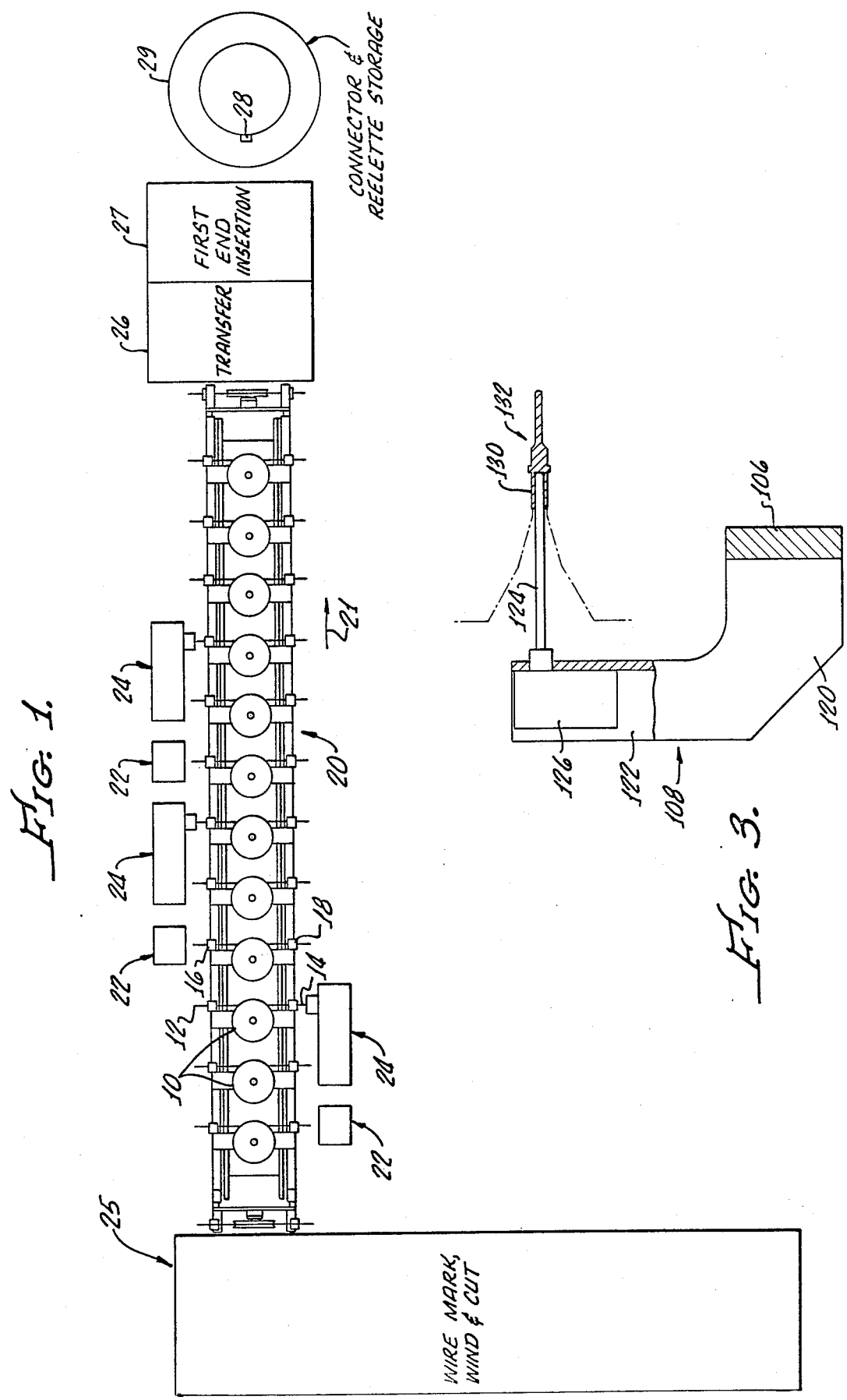
FIG. 1 schematically depicts a wire processing system having a conveyor that moves a number of successive wire carrying reels past stripping and crimping stations positioned at sides of the conveyor.

Illustrated schematically in FIG. 1 are portions of a wire processing apparatus of co-pending application, Ser. No. 615,933, which shows and describes in detail apparatus for winding individual cut lengths of wire on separate small plastic reels 10 with both ends 12, 14 of the wire protruding from the reel. As each successive length of wire is wound upon a reel, the protruding wire ends are grasped in clamps 16, 18, mounted on the conveyor 20, which thus carries the succession of reels, with a single length of wire wound on each, along the conveyor path, as indicated by arrow 21, past one or more stripping stations 22. The conveyor stops when each reel and wire is at the stripping station, where the wire is inserted into the stripping station for suitable stripping of the wire end. After stripping of the wire, the conveyor resumes its motion, carrying the reel and wire ends to crimping stations 24, which embody principles of the present invention. The conveyor stops with the reel and wire at a longitudinal position precisely located to align the wire with a wire guiding path that will receive the wire as it is inserted into a contact positioned in the crimping station, as will be more particularly described hereinafter. The several illustrated stations and the successive reels are spaced along the conveyor so that when the conveyor stops, each station that is to be used has a reel and wire positioned for simultaneous operation of at least several stations. The conveyor also stops for wire marking and reel winding. Wire marking and winding of wire on a reel are carried out during each stop of the conveyor at marking, winding and cutting stations (generally indicated at 25) which precede the stripping stations 22.

Each crimping station 24 is fixedly positioned relative to the conveyor, both laterally and longitudinally thereof, and is provided with a plurality of vertically shiftable crimping assemblies which are movable, in unison, upwardly or downwardly to select one or the other for alignment with the horizontal position of the horizontally directed wire 12 as it is held by the conveyor clamp 16. If deemed necessary or desirable, two, three or more crimping stations, each identical to station 24, may be positioned along one side of the conveyor to provide a larger number of different size crimping assemblies. Stripping and crimping stations may be symmetrically disposed on both sides of the conveyor so that both ends of any given wire may be processed simultaneously.

As schematically illustrated in FIG. 1, each reel, after contacts are crimped to its wire ends, is transported by transport 26 to a first end insertion apparatus 27 for automatic insertion of one terminal into an aperture of a mult-pin connector 28 mounted on a reelette and storage carousel 29. The present invention is directed to the crimping station of the overall system depicted in FIG. 1.

CRIMPING STATION—GENERAL

Figure 2:
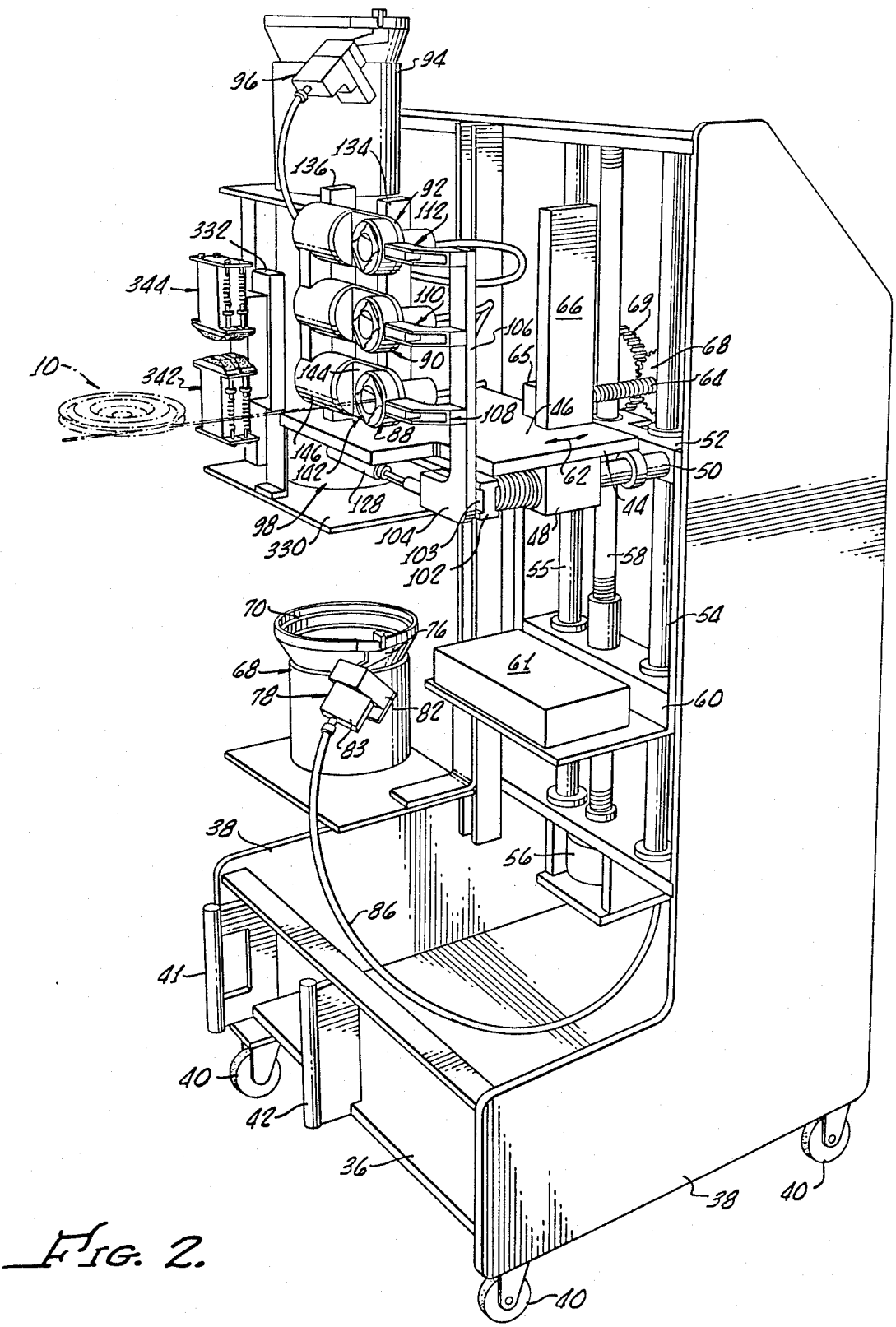
FIG. 2 is a pictorial illustration of one crimping station embodying principles of the present invention.

As illustrated in FIG. 2, a typical crimping station includes a portable crimper support structure having a rigid base 36 and sides 38, mounted on wheels 40 for moving the station into a fixed position relative to the conveyor. When properly positioned relative to the conveyor, the crimping station is rigidly locked in position, both horizontally and vertically, relative to the conveyor structure by means of latching structures, including elements 41, 42, and other latching elements (not shown) on the fixed structure of the conveyor. Thus, during operation the crimper support structure is fixed at all times relative to the conveyor. A vertically and horizontally shiftable crimper carriage 44 is carried on the crimper support structure and takes the form of a fixed plate 46, having fixed depending blocks 48, slideably mounted on a pair of horizontal guide bars 50 (only one of which is shown), which are mounted to the crimper support structure for vertical motion. Guide bars 50 are fixedly carried by a carriage platform 52, which is slideably mounted for vertical motion on a pair of spaced vertically extending guide bars 54, 55. Carriage platform 52 is vertically adjusted by means of a motor 56, which rotates a drive screw 58 that is threaded in the carriage platform 52 and also threaded in a second vertically shiftable platform 60, also guided on vertical bars 54, 55, which carries electrical circuitry 61 for operation and control of the various elements, switches and solenoids, as will be more particularly described below. Electrical control wires have been omitted from the drawing for clarity of illustration. Crimper carriage 44 is bi-directionally driven horizontally in the direction of arrow 62, toward and away from the conveyor, by means of a screw 64 threaded in a traveling nut 65 that is slideably mounted for vertical motion, but otherwise fixed to structural member 66, which is fixed to the platform. The screw is driven via gears 68, 69 and a stepper motor (not shown). Thus the fixed horizontal drive screw accommodates the vertical carriage motion.

Three separate crimping systems are mounted on the crimper support structure. The lowermost crimping system includes a conventional shaker bowl 68 which strores a number of contacts and, by means of bowl vibration, drives these along spiral ramps 70 within the bowl to a bowl output chute 76 which drops the contacts into a sending unit 78 comprising a pair of sender blocks 82, 83 (described in detail below) that pneumatically transmit contacts, one at a time, through a flexible tube 86 to a lowermost one 88 of three vertically assembly and crimping devices 88, 90 and 92.

The shaker bowl 68 is mounted on a fixed portion of the crimper support structure with the sending unit 78 carried on a bracket secured to the shaker bowl. All three of the assembly and crimping devices 88, 90 and 92 are fixedly carried by the vertically and horizontally shiftable crimper carriage 44 in mutually vertically spaced and fixed relation to one another. Also mounted on the fixed crimper support structure are an individual shaker bowl 94, and sending unit blocks 96, for the uppermost assembly and crimping device 92, and a third shaker bowl 98 and sending unit (not shown) for the middle assembly and crimper device 90. The combinations of shaker bowls, sending units and assembly and crimping devices are all identical to one another (except for differences in configuration to enable handling of different contact sizes or types), and only one need be described.

A laterally extending test probe guide beam 102 is fixedly carried by and spans the outer ends of horizontal guide bars 50, and mounts a vertically extending support bar 106 for slideable motion, by means of horizontally extending interengaging T-slot guide elements 103, 104. Bar 106 carries a plurality of vertically spaced test probe assemblies 108, 110, 112. Thus the three probe assemblies are fixedly positioned relative to the assembly and crimping devices and move in unison vertically with vertical motion of carriage platform 52.

Test probe assembly 108 (FIG. 3) includes an L-shaped arm having a first leg 120 fixedly attached to the upstanding support bar 106 and extending outwardly therefrom, and a second horizontal leg 122 extending laterally toward the assembly and crimping device 88. Leg 122 carries an inwardly directed test probe 124 in the form of a long slender rod having a rounded end and a diameter just less than the inner diameter of the wire receiving barrel 130 of a contact 132 which is to be tested. The probe rod 124 has its innermost end connected to a pressure sensing device in the form of a microswitch 126 on probe leg 122, which signals the occurence of pressure on the probe when it encounters an obstacle that tends to axially compress the probe rod. Each of the test probes 110 and 112 is identical to probe 108, and the probes are positioned vertically to be in horizontal alignment with the assembly and crimping devices 88, 90 and 92 respectively. An air cylinder 128 carried on the test probe guide beam 102 drives the assembly of test probes and their support bar 106 laterally of the assembly and crimping devices between a position in which all test probes are laterally displaced from the assembly and crimping devices (so as to clear the wire guide paths of the latter) and a test position in which the test probe rod 124 are axially aligned with a wire guide path (to be described below) in the assembly and test probe devices. Test operations of the probes are accomplished by driving crimping carriage 44 forwardly, as will be described below.

CRIMPER AND CHUCK

Figure 5:
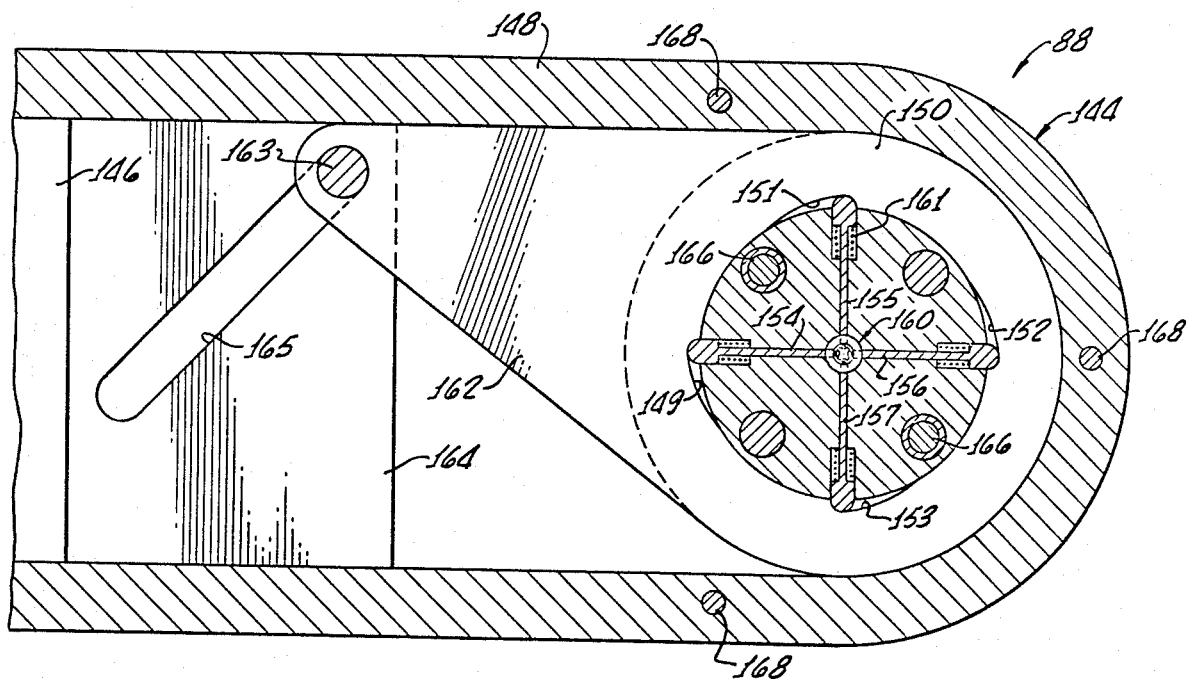
FIG. 5 is a simplified illustration of operation of the crimping arm at the crimping region.

Carriage 46 carries a pair of spaced upstanding crimper columns 134, 136 upon which are fixedly mounted the assembly and crimping devices 88, 90, in mutually vertically spaced relation, all being in precise vertical alignment with one another. As all of the assemblies are identical to one another, except for difference in size or shape of the wire and contact receiving portions to enable them to handle different contacts and different wire sizes, only one need be described. Assembly 88 comprises three main parts, a chuck 140 (FIG. 4), a contact end locator and funnel assembly 142, and a crimper 144. The crimper employs a basically conventional crimping structure, including a motor 146 and a crimper arm 148 (see FIGS. 5 and 6). Operation and structure of the crimper and crimper arm, which is conventional, is schematically illustrated in FIG. 5, which shows an annular ring 150 mounted for limited rotational motion within the arm 148 and have four circumferentially spaced internal cam surfaces 149, 151, 152, and 153, arranged to engage outer ends of four crimping pins 154, 155, 156, and 157, slideably mounted for radial motion to a centrally located crimping region 160. Annular ring 150 is rotated to drive the pins inwardly in a crimping action, or to allow them to be withdrawn under action of a spring 161 by means of a drive arm 162 fixed to the ring and having a follower pin 163 slideably received in an inclined cam slot 165 formed in the end of an air motor driven link 164, which is driven longitudinally of the crimping arm by the motor. The linear travel of arm 164 is suitably controlled by conventional mechanism (not shown) to control the amount of penetration of the inner ends of the crimping pins 154 through 157 into the crimping region in which the wire receiving barrel of a contact is positioned. An inner group of bolts, such as bolt 166, fixedly connects the crimper and crimper arm to the face of the chuck 140, and an outer group of bolts 168 fixedly connects the crimper arm to the funnel assembly 142.

As shown in the cross section of FIG. 4, the chuck 140 includes an outer housing 170, having a fitting 172 to which is connected the end of pneumatic tube 86 which carries from the sending unit 78 to the chuck. Chuck housing 170 is fixedly connected and sealed to a second housing section 174 which, together with housing section 170, forms an air cylinder 176 in which is mounted a hollow piston 178 having fore and aft integral piston sleeves 180, 182. Hoses 184, 186 are connected to supply and evacuate air to the interior of the cylinder on opposite sides of piston 178, thereby to controllably drive the piston longitudinally of the chuck in one direction or the other. Fixed to housing section 170, in a longitudinal bore formed therein, is an elongated split collet 188 having a plurality of circumferentially separate collet fingers, such as finger 190 extending through the hollow piston. The outer surfaces of the forward ends of the collet fingers extend beyond the forward piston sleeve 180, and are flared forwardly and outwardly to form cam followers mating with forwardly and outwardly tapered surfaces 194 formed on the inner surfaces of the forward piston sleeve 180. The hollow collet has a bore which, when the collet is open, is large enough to receive and pass a contact that is sent to and through the collet via the tube 86. However, the collet bore is small enough so that when the piston 178 is driven forwardly to move the collet fingers radially inwardly, a contact such as a contact 196 illustrated in FIG. 4, is firmly grasped by the collet and aligned with the collet axis. The contact has a wire receiving barrel 197 (see FIG. 8) separated from a connecting (pin or socket) end 198 by an enlarged shoulder 199. The collet fingers grasp the connecting end 198 to firmly hold the contact for crimping.

FUNNEL ASSEMBLY

Figure 6:
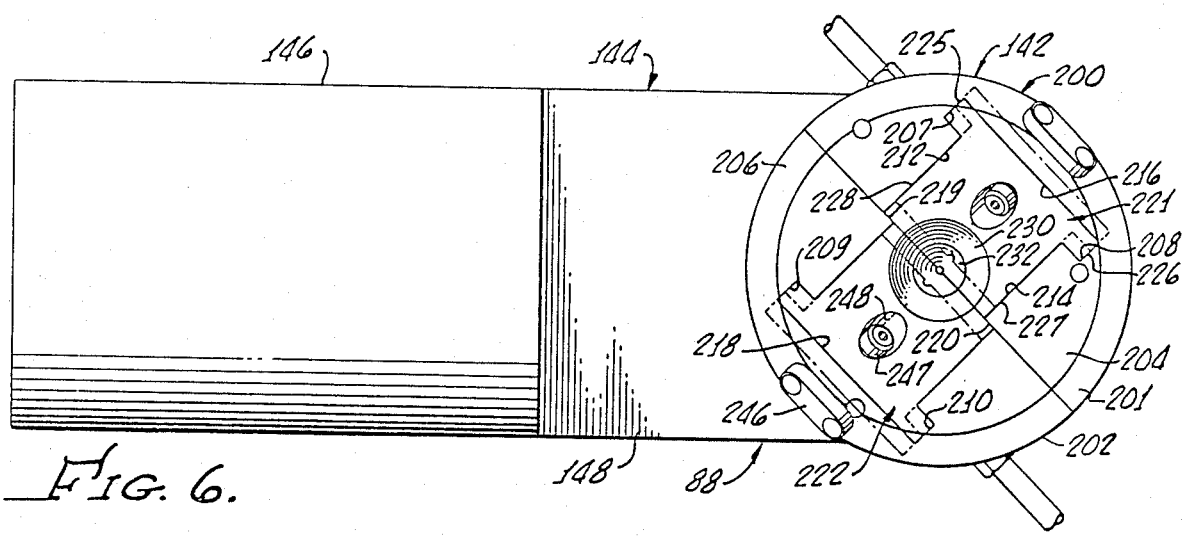
FIG. 6 is a front view of the wire guiding funnel end of the funnel assembly.
Figure 7:
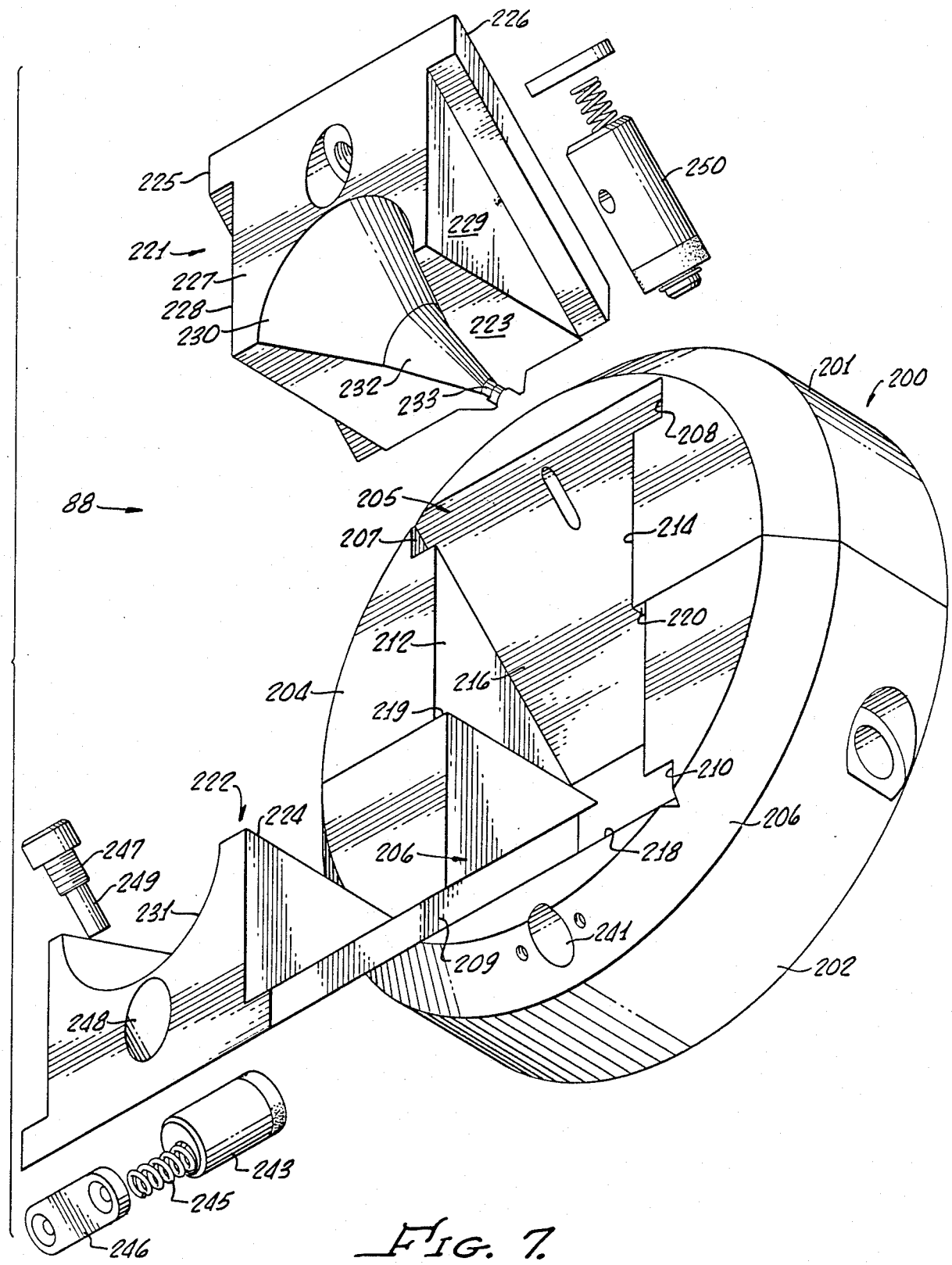
FIG. 7 is an exploded pictorial view of the funnel assembly.

Illustrated in FIGS. 4, 6 and 7 is the funnel assembly 142, which has a number of important functions in assembly of a wire end to the contact that is to be crimped thereon. Because the crimping region (e.g. the operative area of crimper pins 154–157) is small, and because crimper pins must be precisely located at a very short portion of length of the wire receiving barrel of the contact, the end of the barrel must be precisely located relative to the crimping region. The contact end locator, which is a recessed seat formed at one end 143 of the funnel assembly, provides this necessary precision in positioning of a contact at a precise location within and with respect to the crimping region 160 on the crimper. This permits the crimping to be performed close to the free end of the contact barrel. Not only does the contact end locator provide a stop for precision longitudinal positioning of the contact as it is fed through the chuck, but it also provides lateral or radial positioning of the contact and cooperates with the chuck and collet to ensure proper axial alignment of the contact along a wire guiding path. In addition to contact locating functions, the funnel assembly includes a wire guide funnel defining a wire guide path that is precisely aligned with the longitudinal axis of the chuck, and therefore with the longitudinal axis of a contact held in the chuck.

As best in FIG. 7, funnel assembly 88 comprises an annular housing 200 which, for convenience of manufacture, is made of two mating identical parts 201, 202, fixedly bolted together and having a front face 204 chamfered as at 206. Each housing half is formed with a T-shaped slot 205, 206 having transversely positioned and longitudinally extending lateral guide channels 207, 208, 209, 210 and a longitudinally and radially extending central guide channel therebetween formed by facing walls, such as walls 212, 214 of housing section 201. The outer surfaces 216, 218 of the central guide channels are inclined along the longitudinal axis of the housing and converge toward one another from the front face 204. Although the two housing sections are identical to one another, the central guide channels are laterally (radially) offset (FIG. 6) so that when the two parts are mated, longitudinally extending stop shoulders 219, 220 are formed for purposes to be described below.

The contact end locator and funnel functions are provided by a pair of wedge-shaped locator and funnel elements 221, 222 which are identical to one another and have flat inner faces 223, 224 in face-to-face contact when the contact locator elements are in a first or closed position (shown in FIGS. 4 and 8). Element 221 has laterally extending flanges 225, 226 received respectively in lateral guide channels 207, 208 and has a central body portion 227, having side walls 228, 229 which are a close sliding fit between and upon the sides 212, 214 of the central guide channel. Facing surfaces of the elements 221, 222 are formed with forwardly facing wire guide entrance conical funnel surfaces 230, 231 which are of relatively large cone angle, and which merge into inner funnel surfaces of relatively smaller cone angle, as indicated at 232 for element 221. At the rear or contact locator end of the elements 221, 222, the inner conical surfaces merge into a short cylindrical section 233 with a similar mating cylindrical section on element 222, having an inner diameter slightly larger than the outer diameter of the insulation on a wire to which a contact is to be crimped. The rearmost end of cylindrical section 233 is stepped outwardly to form a small annular shoulder 234 (FIG. 8) helping to define an apertured contact end receiving seat 235 that is recessed into the funnel end. The seat of each crimping assembly is specifically configured and dimensioned for reception of a specific contact barrel. Thus each crimping assembly may have a different seat. On the end of the contact end locator which faces the crimping region and chuck, the outer surfaces of the rearmost ends 236, 237 of the elements 221, 222 protrude (in closed position) beyond the rear surface 238 of housing 200. The outer conical surface formed by contact end locator ends 236, 237 is conical to mate with a conical entrance 239 to the aperture of crimp arm 148 which leads to the crimping region 160. In the closed position, shown in FIG. 8, the conical ends 236, 237 terminate just at or slightly short of the crimping rods 155, 157 to avoid interference with the motion of these rods. The inner surfaces of the ends 236, 237 form a short cylindrical wire barrel receiver 240 which cooperates with seat 235 to precisely position the wire barrel 197 of contact 196. The entrance to receiver 240 is outwardly tapered to facilitate entrance of a contact barrel 197 into the receiver 240 and seat 235. This arrangement allows the free end of the wire barrel to be precisely located on its seat within the crimper structure and very close to the crimper rods. Thus adequate tolerance on depth of wire insertion is provided and, the crimping does not interfere with the wire insertion inspection aperture 195 (FIG. 11).

In each housing section is drilled a bore 241, 242 (FIG. 4) extending parallel to inclined surfaces 218 and 216 in which are mounted air-driven pistons, such as piston 243, that is driven outwardly of the bore 241 by air admitted from an air hose (not shown) via an input port 244 to the interior of the air cylinder defined between the end of the piston 243 and the bore 241. Piston 243 has an axially elongated recess in which is mounted a compression return spring 245 that bears against a spring end cap 246 bolted to the outer surface of the housing section. A headed drive pin 247 is threaded into a countersunk aperture 248 formed in the front face of wedge-shaped body 222, and has an unthreaded stem 249 extending into an aperture formed in the body of piston 243 (see FIGS. 4 and 7). Accordingly, when the cylinder formed by bore 241 is pressurized, the piston and contact end locator element 222 are driven outwardly, toward the front face of housing 200 in a direction parallel to the extent of the inclined surface 218. Upon release of the air pressure, return spring 245 drives the piston and element 222 rearwardly and inwardly until the inner surface 219 thereof contacts stop shoulder 220 (FIG. 6) on the other housing section, to thereby precisely limit the innermost position of the element 222. An identical piston 250 mounted in bore 242 the other section of the housing, is connected to the other funnel element 221 and is configured and operates in an identical fashion and in synchronism with piston 243 and element 222. Shoulders 219, 220 of the funnel assembly housing ensure that the wedge-shaped elements 221 and 221, when driven together by the return springs will come together precisely on the desired center line or wire guide path. Thus the shoulders help to constrain each of the wedge-shaped elements to slide between precisely defined positions.

The two identical slideable elements 221, 222 of the funnel assembly are simultaneously shiftable in the housing 200 between the closed position shown in FIGS. 4 and 8 and an open position shown in FIGS. 9, 10 and 11, and in dotted lines in FIG. 4. In closed position the elements 221, 222 form a wire barrel receiving recessed seat that closely fits the contact barrel and is precisely positioned actually inside of the crimping region and close to the crimping rods, by the stop shoulders 219, 220 and by the tapered entrance 239 to the crimp arm aperture. In open position, the funnel assembly elements 221, 222 are withdrawn from the crimp arm aperture and mutually separated by the sliding motion of the pistons 243, 250 which drive the elements 221, 222 with both axial and radial components of motion. This inclined direction of motion enables the seat 235 to be positioned inwardly of the outer surface of the crimping arm, close to the crimping region in one position, and yet to have its parts mutually separated in a second position so that the contact may pass through the separated seat parts.

With the particular crimping actuation and operation employed in the described embodiment, the end of the contact barrel, when properly located for crimping operation, is positioned within the crimping region inwardly of the outermost side of the crimping arm 148. This provides for compactness of the crimping station and facilitates precise positioning of the wire barrel end close to the crimper pins. Thus the contact end locator seat, to properly position the barrel end within the crimping region, must enter the crimping region for a short distance. For this reason, the parts of the seat cannot simply be separated to permit withdrawal of the crimped contact simply by laterally spreading these apart. Accordingly, the separation motion of the contact end locator elements includes components of motion axially of the wire guide path, in addition to components of motion directed radially outwardly of the wire path. In the described apparatus, both of these components of motion are provided by the inclined guide surfaces of the housing, which guide the contact end locator elements in inclined paths along the wire guide path and toward and away from the central axis of the device.

In order to position a contact for crimping with the apparatus described above, a contact is sent by air pressure via the pneumatic tube 86, through the collet fingers which initially are in their outer, relaxed position, with piston 178 in its rearmost position (toward the right as seen in FIG. 4). Initially the contact is stopped by abutment with the ends of the wedge-shaped contact end locator elements, which at this time are in their innermost mating position, shown in solid lines in FIG. 4. The bore formed by the cylindrical portion 233 of the contact end locator is smaller than the outer diameter of barrel 197 of the contact, so that the contact is stopped by the closed contact end locator ends 236, 237. However, because of variations in contact sizes and other tolerances, the end of the contact barrel may not initially find its proper position in the seat 235. To the contrary, the contact, when it first reaches and abuts the contact end locator, may be misaligned relative to the axis of the collet. It may be stopped short of abutment of its end with the inner portion of seat 235, or the end of the contact may be radially displaced somewhat from the axis, or the contact may be tilted. Because the contact is quite small and very little weight, it is readily subject to forces or particles that may tend to disturb its proper and desired location and orientation.

To ensure that the barrel end of the contact is properly seated in the contact end locator seat 235, properly positioned longitudinally and radially, and properly oriented, piston 178 is reciprocated three or four times to cause the collet fingers to repetitively grasp and release the collet, while at the same time the air pressure is maintained, continuously tending to drive the contact toward its seat. The combination of repetitively grasping, releasing and again (and finally) grasping of the contact while the longitudinally directed force of the air pressure continues ensures that the contact will be axially aligned, radially centered, and properly seated. This ensures proper and critical location of the contact barrel within the crimping region of the crimping arm for the final grasping of the barrel by the collet. This proper positioning is essential in order to obtain the optimum crimping action, particularly in view of the fact that the area in which the crimping must occur is limited to a relatively short distance along the length of the contact barrel. The reciprocating collet piston cycles are initiated just after the contact is pneumatically driven through the collet, as by a signal derived from an optical sensor (not shown) in the chuck housing. Alternatively, the collet piston reciprocation may start after a short delay period initiated when the contact is sent from the sending unit 84.

Having properly located the end of the contact in the contact end locator seat, and having securely grasped it in the chuck, it may be desirable to perform a test to determine whether the contact is properly oriented, that is, whether or not the barrel end 197 or the opposite (pin or socket) end 198 is positioned at the seat. This will double check contact orientation provided by the shaker bowl. In addition, the barrel may be distorted or of the wrong size. To test for these conditions, the test probe vertical support bar 106 is shifted laterally by actuation of air motor 128 (FIG. 2) to move the test probe rod 124 (and all test rods) a predetermined lateral distance, into alignment with the axis of the funnel assembly 142. Now the crimper carriage 46 is driven forwardly by rotation of screw 64 to carry the entire assembly and crimping device forwardly a predetermined distance toward the end of the probe rod 124, causing the chamfered end of the rod to enter the barrel a predetermined distance (FIG. 3). If the contact should be misoriented by 180°, or the barrel is distorted, or for some other reason the probe rod 124 is unable to enter the contact barrel for the predetermined distance, the rod is urged backwardly and caused to actuate switch 126 to signal the problem so that appropriate corrective action (blowing out and discarding the defective contact, for example) can be taken. If it is decided that this testing will not be necessary, it may be eliminated, and also, those elements of the device, including elements 102,103,104,106,108,110,112 and 128 shown in FIG. 2, and including the test elements shown in FIG. 3 that are provided for such testing, may be omitted.

If the test indicates no problem with proper configuration and orientation of the contact, carriage 46 is retracted to effectively withdraw the probe rod from the funnel assembly, and the group of test probes on vertical support bar 106 is then shifted laterally to a position where the test probes are displaced from the assembly and crimping devices and the wire guide paths formed thereby.

Having completed the test and determined that the contact is properly located, the stripped wire may now be assembled to the contact to provide the relative positioning of stripped wire and contact illustrated in FIG. 9. To accomplish the positioning, assuming that a reel 10 and wire end 16 protruding from the reel and held in a clamp on the conveyor are properly positioned along the conveyor length FIGS. 1 and 2) with the wire end extending in substantial alignment with the wire guide path defined by the contact end locator funnel, the carriage 46 is again moved forward, toward the conveyor, a predetermined distance, causing the end of the stripped wire to enter the funnel, and to be guided by the still closed funnel surfaces 230, 231 through the cylindrical bore 246 and through the contact end seat 235 a short distance into the barrel of the contact. The motion of the carriage toward the conveyor and toward the test probe through this predetermined distance may be controlled by various means well known to those skilled in the art. It is presently preferred to employ a stepper motor in an open loop drive to provide a selected number of drive pulses, each providing a fixed increment of screw rotation so as to accomplish the motion of the carriage 46 through a precisely determined distance.

After the bare wire end has been entered a short distance into the barrel, the funnel parts are opened and the wire insertion into the barrel is then completed to attain the position shown in FIG. 9. This two step insertion is necessary because the diameter of bore 233 is less than the wire insulation diameter.

With the bare wire end properly positioned within the contact barrel, as shown in FIG. 9, and with the barrel held and precisely positioned by the chuck within the crimping region of the crimping arm 148, the crimper is actuated to drive arm 164 forwardly, rotating the annulus 150 and driving all the crimping pins radially inwardly, as shown in FIG. 10. The crimping pins are then retracted by rotating the annulus 150 in the opposite direction to allow the rod springs to push the rods outwardly. Both of the cylinder bores 241, 242 are pressurized to drive the pistons 243 to their forward position and slide the two contact funnel elements 221, 222 to the retracted position shown in FIGS. 9, 10 and 11. In retracted position, two elements are sufficiently displaced so as to readily accomodate passage of the entire contact, including the enlarged shoulder 199, through the now opened contact end locator seat along the wire guide path lying along the axis of the wire receiving funnel. It will be understood, of course, that with the contact end locator elements 221 and 222 in their closed, contact locating position, the diameter of the seat 235 and bore 233 are small enough to prevent passage there through, not only of the contact shoulder 199, but also of the contact barrel 197. Thus it is necessary to separate the two contact end locator elements. With certain types of wire, the diameter of the wire insulation is also greater than the diameter of bore 233, and, if necessary, the funnel elements may be driven apart before insertion of the wire, as indicated in FIG. 9.

Withdrawal of the wire and crimped contact through the funnel assembly (FIG. 11) is accomplished by retracting the crimping carriage 46 until it once again reaches a position wherein the face 204 of the funnel assembly housing is out of the path of the wire end as it is carried along the conveyor.

SENDING UNIT

FIGS. 12 through 16 shows construction and operation of a sending unit and bowl feeding chute such as the sending unit 78 of FIG. 2. A mounting bracket 251 (FIG. 14), fixedly connected to the fixed shaker bowl structure, fixedly supports a nonmoving sender body 82 to which is pivotally mounted a generally L-shaped sender unit pivot block 83. The pivot block is mounted to the body for limited pivotal motion about the axis of a pivot pin 252 between a receiving position illustrated in FIGS. 12 and 14 in which a contact received from the bowl chute is fed through the sending unit to the pneumatic sending tube 86, (without application of air pressure to the tube) and a sending position, illustrated in FIG. 15, wherein air under pressure is applied from a source of pressure (not shown) via a pressure tube 253 through mating conduits in the sender body and pivot block to the sending tube 86, so that the air pressure will drive the contact through the pneumatic tube to the assembly and crimping device 88, as described above.

Sender body 82 comprises a substantially rectangular block having a flat upper surface 254 (FIG. 12) formed with a feed chute receiving recess 255 in which rests the end 256 of the shaker bowl feed chute 76. Recess 255 communicates with a feed conduit 257 in the sender body, which in turn communicates with and is in alignment with (in receiving position) a bore 258 extending entirely through the pivot block 83 for connection to pneumatic sender tube 86 by means of a fitting 259.

A cylindrical cavity 260 (FIG. 13) formed in a sender body 82 slideably mounts a double ended piston 261 which can be driven in either direction along the axis of the cylinder by air admitted to either end of the cylinder via pressure and exhaust hoses 262, 263 (FIG. 16) connected to the ends of cylinder 260 via internal bores 264, 265. Fixed to and extending radially from the piston, and captured in an elongated slot 267 formed in sender body 82, is a drive shaft 268 having its distal end pivoted to a slide block 269 that is slideably mounted in an elongated recess 270 formed in that face of pivot block 83 which is contiguous to the adjoining face of the sender body. Thus, as piston 261 is driven downwardly (as viewed in FIG. 16), the slide block 269, which is offset from the axis of pivot shaft 252, is also driven downwardly to cause block 83 to pivot about the pivot shaft axis. In the course of this pivotal motion, the slide block 269 moves a small distance longitudinally within the elongated slot 270.

Fixed to and projecting outwardly and downwardly from a lower portion of the sender body 82 is a stop body 272 (FIG. 16), having first and second stop surfaces 273 and 274. Stop body 272 is received in a stop recess formed in one leg 276 of the L-shaped pivot block 83. Pivot block leg 276 is integral with and extends at right angles to the other leg 277 of pivot block 83 and defines sides of the stop block receiving recess by means of stop legs 278, 280. An adjustable stop in pin 281 is threaded in and extends through the second stop leg 280 to abut against stop surface 273 of the sender body to limit pivotal motion toward the receiving position (FIG. 14). Stop leg 278 of the pivot block abuts stop surface 274 of the sender body to limit pivotal motion of the pivot block to the sending position shown in FIG. 15.

Optical sensing means mounted in a bore 286 (FIG. 12) that extends through the pivot block from side to side thereof and intersects the contact receiving bore 258 thereof mounts a light emitting source at an end 287 thereof for cooperation with a light receiving sensor at an end 288 to enable the apparatus to signal passage of a contact through the bore 258. If deemed necessary or desirable, a second optical sensor (not shown) may be mounted in the sender body to sense presence of a second contact. A second contact, erroneously fed to the sender body, could be caught in a position spanning the sender body and pivot block and prevent motion of the latter to sending position. A second sensor would signal this condition to enable appropriate corrective action to be taken.

Figure 12:
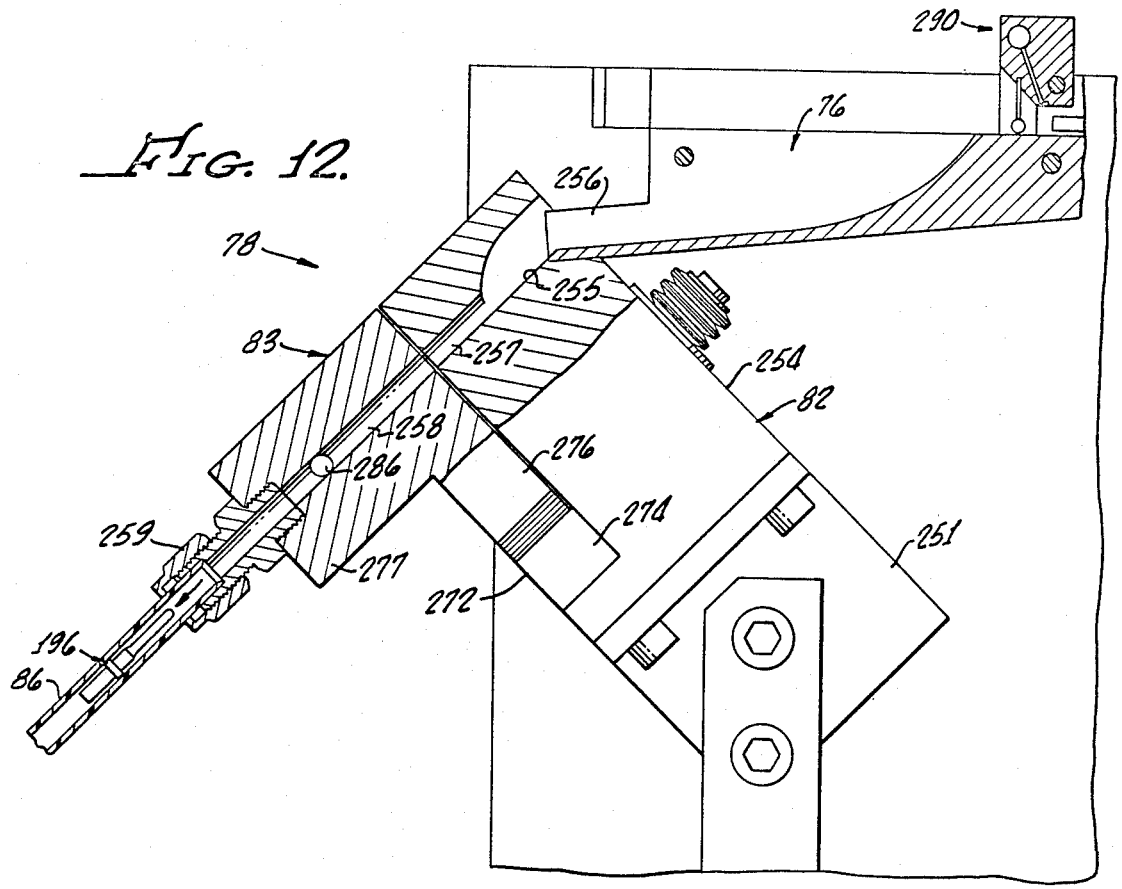
FIGS. 12 and 13 are side elevation views, partly in section, showing the sender unit in receiving and sending positions respectively.
Figure 13:
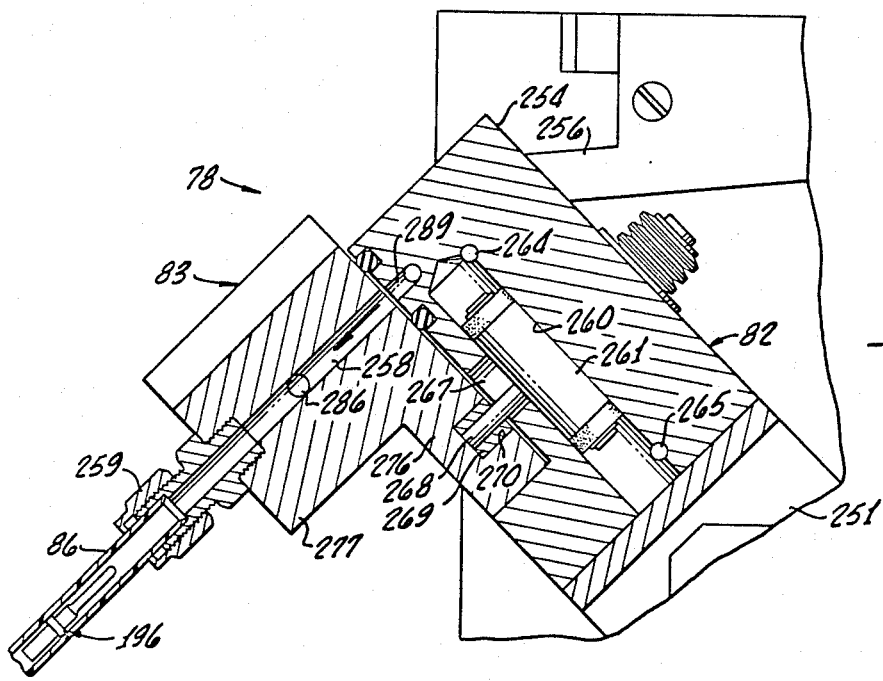
Figures 20, 21:
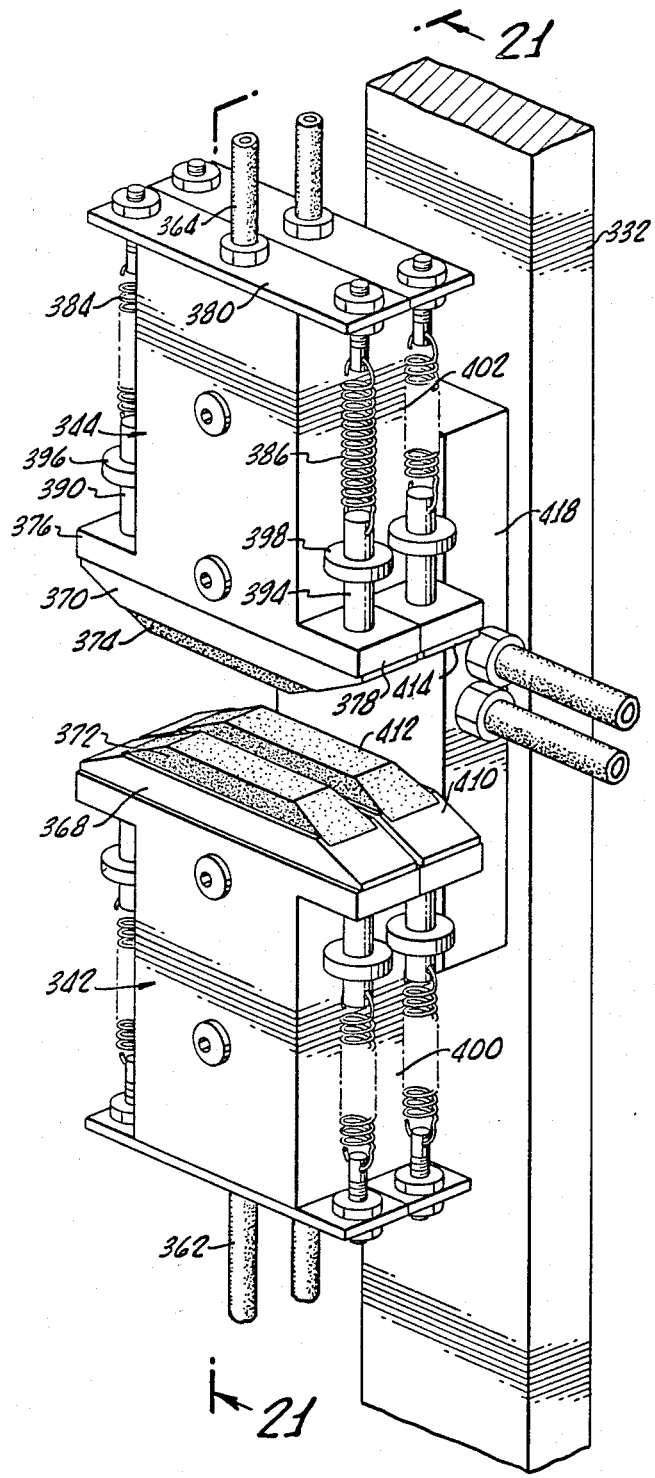
FIG. 20 is a pictorial illustration of the pull test apparatus.
FIG. 21 is a section taken on lines 21—21 of FIG. 20, showing the parts in a first position.

In operation of the sender unit, a contact is fed by gravity along contact feed chute 76, from which it falls into the receiving recess 255 and thence falls through bore 257 in the sender body and through the aligned bore 258 of the pivot block, which is now in its receiving position, as illustrated in FIG. 12, to enter the pneumatic tube 86. Passage of the contact through the bore 258 of the pivot block causes the optical sensor to send a trigger signal which operates a solenoid (not shown) that admits air under pressure via conduit 262 to drive the piston to one end of the cylinder 260, causing the pivot block to pivot in a direction such as to cause pivot block stop leg 278 to abut the sender body stop surface 274. In this position, bore 258 of the pivot block is no longer aligned with the receiving bore 257 of the sender body, but is in fact aligned with an internal bore 289 and in communication therewith, which bore is connected to the air hose 253 which provides pressurized air via the sender body, through bore 289 and through bore 258 to the pneumatic tube 86, to thereby pneumatically drive the contact within the tube 86 to the assembly and crimping device 88. After a predetermined time delay, or upon sensing of passage of the contact through the chuck by an optial sensor (not shown) in the chuck body, the other end of cylinder 260 is pressurized via conduit 263, exhausting air from the first end of the cylinder via conduit 262, to thereby move the pivot block back to its receiving position, as illustrated in FIG. 14, wherein it is ready to receive the next contact. When in the sending position of FIG. 15, passage of the next contact into the pivot block conduit 258 is blocked because this conduit is no longer aligned with the sender body bore 257.

CONTACT FEEDING SEPARATION

It will be readily appreciated that many different types of feed mechanisms may be employed to feed contacts to the sending units in suitably chronologically spaced sequence. Thus the arrangement of the sending unit itself may be so timed that the pivot block 83 remains in its sending position, blocking receipt of the next contact, until the operation at the crimping station has been successfully completed. Nevertheless, it is desirable to prevent a series of contacts fed or attempted to be fed to the sending unit in close physical and/or chronological proximity. To prevent the contacts from being too closely spaced, it is desirable to separate the contacts as they are fed from the feeder. Illustrated in FIGS. 17, 18 and 19 is an exemplary contact separator 290 attached to the shaker bowl 68 just ahead of its output ramp or chute 76. Separator 290 is formed of a substantially U-shaped block, having an intermediate bight 291 and side legs 292, 293, which straddle the upright side wall 294 of the shaker bowl. A central rearwardly projecting block part 295 extends rearwardly from the center leg or bight 291, spaced above the bowl ramp 70, and is formed with a horizontal laterally directed aperture 296, receiving a threaded bolt 297 extending through a suitable hole in bowl wall 294 to thereby fixedly secure the separator to the bowl. A horizontally curved cam plate 298 is secured to the inside of bowl wall 294 (between the wall and block part 295) to guide a contact along the bowl ramp 70 into a precise lateral position under block part 295. Block part 295 is formed with an aperture 299 communicating with an internal jet conduit 300 extending downwardly and rearwardly so as to project a high velocity jet of air supplied to the conduit 300 via aperture 299 and an air hose 302.

Separator legs 292 and 293 each have mutually aligned laterally extending apertures in which are mounted sending and receiving components 303, 304 of an optical sensor.

In operation of the separator, a first contact 308 guided by plate 298 to pass directly under the output port of jet conduit 300 and directly across the line of sight between the optical sensor components, causes a signal from the optical sensor to open a compressed air valve (not shown) coupled to conduit 302 to thereby direct a downwardly and rearwardly projected high velocity air jet against any contact that immediately follows contact 308. Accordingly, should a contact, such as a contact 310, be closely following contact 308, the air jet stops further progression of the following contact 310. The air jet remains on, stopping passage of further contacts beneath the separator, for a predetermined period of time sufficient to ensure that contacts are not fed in too rapid a succession to the sender unit, and in particular, to avoid the possibility of having a contact bridging the sender body 82 and the pivot block 83 as the latter is pivoted. A signal produced upon completion of a crimping operation at the crimping station, or upon passage of a contact through the chuck, may also be used to turn off the air jet and allow the next contact to be fed to the sender, after driving the pivot block back to its receiving position.

PULL TEST

After the contact had been crimped upon the wire, and the wire and contact withdrawn from the crimping station, the crimping performance is tested. This is achieved at the pull test station, which is fixedly positioned relative to the crimping station, at a selected distance downstream along the conveyor. Accordingly, after a wire has had a contact crimped on its end, and the crimping station has been withdrawn to permit continued passage of the wire along the conveyor length, the conveyor, which had been stopped for the crimping operation, is restarted to carry the wire and contact a short distance to the pull test station. The pull test station is fixedly mounted on the crimper support structure 38 by means of a fixedly attached test support plate 330 (FIG. 2). As illustrated in FIGS. 20 through 24, the pull test station includes a fixed mounting plate 332 fixedly supported upon and upstanding from the fixed test support plate 330. Plate 332 carries lower and upper pairs of forwardly extending fixed tie-rods 334, 336, and 338, 340. Fixed to the lower and upper pairs of tie-rods are lower and upper stationary cylinder housings 342, 344, each of which is formed with a pair of laterally spaced, vertically extending cylindrical piston receiving bores 346, 348 and 350, 352, which slidebly receive pincher pistons 354, 356, and 358, 360. Pressurized air is admitted to the cylinder bores by means of air hoses and ports 362, 364, communicating with both piston cylinder bores of the upper pair by means of a common conduit, and with both piston cylinder bores of the lower pair by means of a common conduit. Fixed to and bridging the outer ends of the lower pair of pistons 354, 356 and similarly fixed to and bringing the upper pair of pistons 358, 360, are lower and upper pincher bases 368, 370 carrying resilient, but firm, plastic pincher pads 372, 374, which form a stationary pair of pull test jaws. Each cylinder housing has upper and lower laterally outwardly projecting flanges on both sides thereof, as indicated by lower flanges 376, 378 of upper stationary cylinder body 344 and upper flanges thereon formed by ends of a cover plate 380. On both sides of the upper stationary cylinder body 344 are mounted tension springs 384, 386 connected at their upper ends to respective ends of the fixed cylinder upper cover plate 380, and at their lower ends to shafts 390, 394 which extend through the flanges 376, 378 for connection to opposite ends of the pincher base 370. The inner ends of shafts 390, 394 threadly receive lock nuts 396, 398 which bear against the upper surface of flanges 376, 378 to adjustably limit downward motion of the pincher base and pads 372, 374 when driven by the upper pistons. Upon release of air pressure within the cylinder bores, the tension springs retract the upper and lower pincher bases and pads, moving the pincher jaws apart.

Slideably mounted for motion axially along the tie-rods 334, 336, 338 and 340, are movable cylinder housings 400, 402 which are substantially identical to the stationary cylinder housings 342, 344. Like the stationary cylinder housings, each movable housing includes a pair of laterally spaced cylinder bores mounting individual pairs of pincher pistons, each pair carrying a pincher base and pad 410, 412, and 414, 416, which form a movable pair of pull test jaws. The movable cylinder housings each have pairs of retraction springs identical in operation and configuration to the retraction springs of the stationary cylinder housings.

Figure 23:
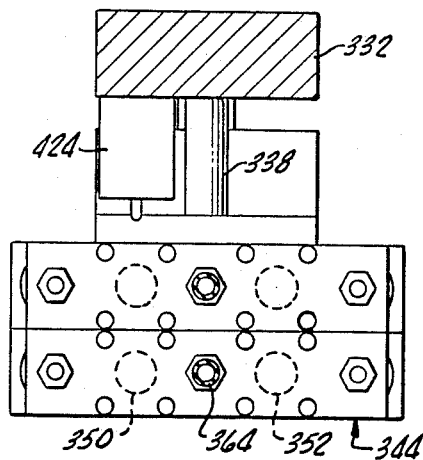
FIG. 23 is a top view of the apparatus of FIG. 20.
Figure 22:
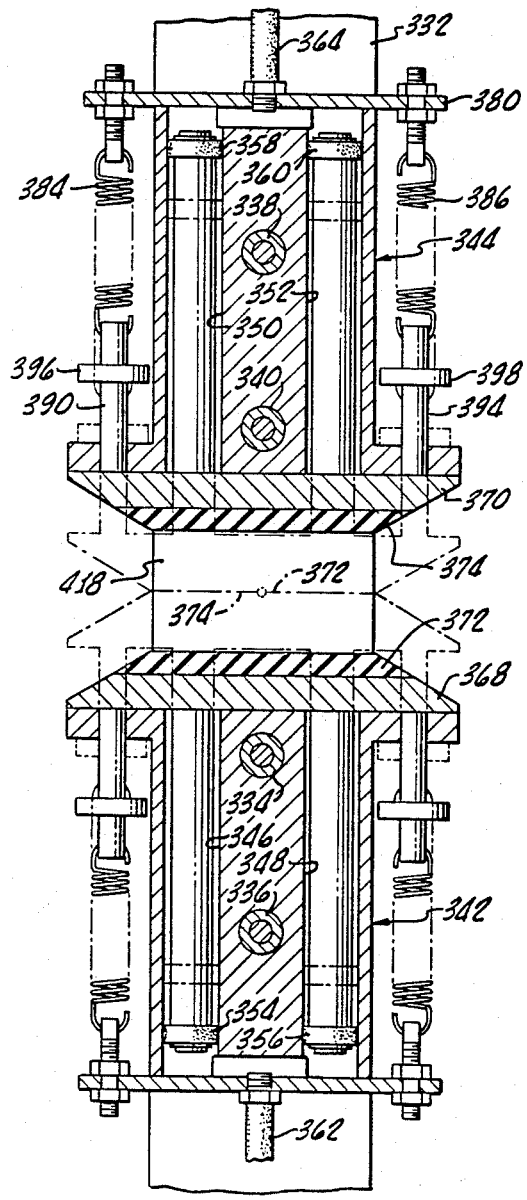
FIG. 22 is a section taken on lines 22—22 of FIG. 21.

Upper and lower movable cylinder housings 400 and 402 are fixedly connected to one another by means of a cylinder tie plate 418 which is slideably mounted upon tie-rods 334, and 340. Pull test pistons 406 mounted in cylinders 408 of housings 400, 402 and tie plate 418 are actuated by pressure introduced into the cylinders at the right end of the pistons (as seen in FIG. 23) to urge the movable cylinder housings and the movable pair of jaws away from the stationary housing and stationary pair of jaws. The pull test pistons bear against the stationary cylinder housings 342, 344. If the movable cylinder housings move relative to fixed plate 332 (see FIG. 24), a switch 424 is actuated to signal a loose contact. A movable cylinder housing return piston 420 has an end seated in a cylinder recess 422 formed in mounting plate 332, with the other end of the piston being received within a cylinder formed in the cylinder tie plate 418 so that pressurization of the cylinder between the left-most end of piston 420 (as viewed in FIG. 24) and the tie plate 428 will drive the cylinder tie plate toward the left, to its normal or return position, shown in FIG. 21.

OPERATION

Because the embodiment of the crimper described herein has been designed as part of an overall wire processing system, and because other operations performed on the system may take a considerably longer time than any or all of the crimping or testing operations, the amount of time available during each conveyor motion stop is not critical, and is actually more than needed. The overall wire processing system of which this crimper may form a part involves withdrawing the wire from a spool, measuring and marking the wire, winding the wire upon a reel, cutting the trailing end of the wire, mounting the reel and wire on the conveyor, then conveying the reel and wire along the conveyor to and past the various end finishing stations, including the crimping station disclosed herein. In such a system, marking and wire winding on the reel may require as much as eight seconds, and during such an operation all other operations on this continuous assembly line and conveyor must stop. Thus, when one reel is stopped at the crimper for a crimping operation, the conveyor is stopped and a following reel and wire (possibly several reels upstream along the conveyor) may be in the process of being wound on its reel. Only after such winding is completed can the conveyor be started up again to move the next reel to a crimping station and to move the reel at the crimping station to the pull test station or to some other station that follows. However, certain sequencing of the various crimping operations (carried out while a reel on the conveyor is stopped at the crimping station) is necessary and desirable. Such sequencing is readily controlled by a suitable electronic controller, or a conventional digital computer, together with optical sensors, which sends out appropriate signals at the desired times to operate various motors, valves, solenoids and other electro-mechanical devices, well known to those skilled in the art, for initiating the described actions.

A typical timing sequence for the crimping operation is as follows. Assume that the crimper carriage is retracted. Initially the elements 221 and 222 of the funnel assembly are in their first position, in close contact with each other to form the contact barrel receiving seat 235 at the crimping regions and inwardly of the exterior of the crimper arm. The crimping pins are retracted, the sender blocks in receiving position illustrated in FIG. 14, and the air pressure to the separator 290 shut off. With the shaker bowl operating, a line of contacts is vibrated along the ramp or track of the bowl, and, as the first contact passes the separator sensor, the separator air jet is turned on to stop further motion of contacts following the first contact. However, the bowl continues to vibrate to ensure further passage of the first contact to the sender blocks. This first contact then falls by gravity along the shaker bowl output chute into the sender body through the aligned passages in the sender body and pivot block, stopping either in the pivot block or in a portion of the pneumatic tube adjacent the block. Prior to this time the air pressure to the second passage of the sender block has been blocked. When the sensor in the pivot block detects passage of a contact through the pivot block, the pivot block drive piston is actuated to shift the pivot block to its sending position, the air pressure to the second passage of the sender body is turned on to blow through the now aligned air passage 289 of the sender body and passage 258 in the pivot block, and operation of the shaker is stopped. The separator air jet is also turned off at this time.

After a short delay to allow transport of the contact from the sender to the chuck, or upon a signal from an optical sensor (not shown) in the chuck which denotes arrival of a contact at the chuck, the reciprocating cycling of the chuck piston is initiated while the pneumatic tube air pressure is maintained. At the end of this reciprocating cycling (three to five cycles, for example), the contact is seated in the funnel assembly, properly oriented and firmly held in that position by the closed collet fingers. The end of funnel assembly seat remains as described, slightly inside the outermost wall of the crimper arm and the just short of the crimping region, to ensure avoidance of intereference with motion of the crimping pins. The group of tester probes is now laterally shifted into alignment with the assembly and crimping device axes, and the crimper carriage is advanced toward the test probe. The probe rod passes through the funnel and into the contact barrel. The probe is then withdrawn by retracting the carriage, and the assembly of testor probes is shifted to the side again. If the probe is unable to enter the contact barrel, the probe switch 126 generates a signal that retracts the carriage to withdraw the probe, retracts and separates the funnel assembly elements, releases the contact from the collet, and blows the contact out through the funnel assembly, to be discarded.

If the test probe does not show a failed contact orientation or otherwise improper contact, the carriage is advanced to a predetermined position, with the funnel assembly elements in their closed position to guide the wire end, to only partly insert the bare wire end into the contact barrel. The amount of advance is controlled by the carriage advance stepper motor 68, so that the wire end enters the contact barrel but stops before the wire insulation, which is of greater diameter than the smallest part of the funnel opening, contacts the still closed funnel parts. Now the drive cylinders of the two funnel assembly elements are actuated to move these elements to their displaced position, withdrawing the funnel end from the crimper arm aperture. After the carriage advance has been momentarily stopped, to allow the funnel elements to part, the carriage advance is completed to insert the wire end fully into the contact barrel, with the end of the insulation bearing, or nearly bearing, against the contact barrel end. Now the crimper pins are operated to achieve the crimping of the contact barrel to the wire, the contact is released from the collect and the carriage withdrawn so that the now properly terminated end of the wire may be carried by the conveyor to the pull test station, where the pull test is carried out during the next stop period of the conveyor. The funnel assembly elements are driven to their closed position with the seat 235 within the crimper arm, ready to receive the next contact.

The spacing, along the length of the conveyor, between the pull test station and the crimping device of the crimping station is equal to the spacing of successive reels on the coneyor (or a suitable multiple thereof), so that when a first wire on a first reel is positioned at the pull test station to test the crimping of the contact, the immediately following reel is at the crimping station having a contact attached to one or both ends of the wire wound thereon. Thus, at the next stop of the conveyor, the crimped wire end is at the pull test station.

The pull test station is fixed to the fixed crimper structure and therefore fixedly mounted relative to the conveyor and positioned so that the plane of the junction between the pincher pads when they are driven into abutment with each other, (e.g. the junction illustrated in dotted lines in FIG. 22 between pads 372 and 374) lies in the plane of travel of the end of a wire and contact carried by a reel along the conveyor from the assembly and crimping devices. The pull test station, as a whole, does not move vertically or horizontally relative to the conveyor. Only its parts move.

Figure 24:
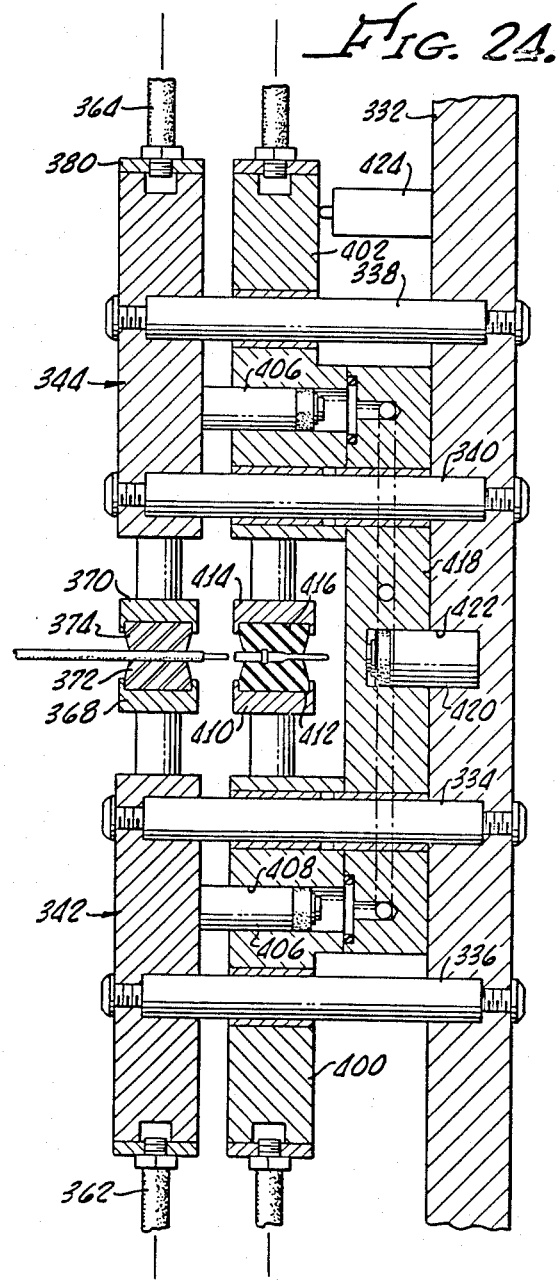
FIG. 24 is a section similar to FIG. 21 showing the parts in a second position.

The pull test station is positioned laterally of the conveyor so that pincher pads 372, 374, may grasp the wire insulation, and pads 412, 416, may grasp the contact. Thus, as the wire is borne by the conveyor to the pull test station, the conveyor stops with the wire positioned between the two open pairs of jaws of the pull test station, which is in the position illustrated in FIG. 20. The wire insulation is positioned between pads 372, 374 of the outer jaws, whereas the contact now crimped to the end of the wire is positioned between the movable pair of jaws formed by pads 412, 416. With the wire and contact positioned between the pairs of jaws, the pistons of the stationary cylinders are actuated to drive the pads 372, 374 together to grasp the insulation, and only the insulation, of the wire. Simultaneously, the pistons of the movable cylinders are actuated to drive pads 412 and 416 together to grasp only the contact that is crimped to the wire end. Now both pull test pistons 406 are actuated, by pressurizing the interior of the cylinders to the right of the piston, to thereby tend to drive the cylinder tie plate, and thus both movable cylinders and the inner pair of jaws toward the right relative to the outer pair of jaws, from the position of FIG. 21 toward the position of FIG. 24. The arrangement of the pull test pistons and cylinders and their pressurization is such as to exert a tensile force of approximately three pounds, tending to pull the crimped contact off of the end of the wire. If the contact is not properly crimped upon the wire, it is removed from the wire, and the tie plate will move to the right to actuate limit switch 424, indicating a failed crimp, as shown in FIG. 24. If the crimping operation has been carried out properly, the three pound pull exerted during the crimping test is not sufficient to overcome the frictional grasping of the wire and contact by the pull test jaws, and no motion of the movable cylinders and stationary tie plate occurs. The pull test jaws are then opened and the wire and its tested crimped contact now proceeds down the coneyor.

The foregoing detailed description is to be clearly understood as given by way of illustration and example only, the spirit and scope of this invention being limited solely by the appended claims.

What is claimed is:

1. Wire crimping apparatus comprising
   crimping means having a crimping region for receiving a contact to be attached to a wire end and for crimping a contact at said crimping region,
   a contact end locator having a contact end locator member positioned at a predetermined distance from and on one side of said crimping region, said contact end locator having a wire guiding path leading to said contact end locator member,
   hollow clamp means on the other side of said crimping region for holding a contact,
   means for feeding a contact through said hollow clamp means to said crimping region and into a position in abutment with said contact end locator member,
   means for actuating said hollow clamp means to hold said contact in said position,
   means for feeding a wire end along said wire guiding path to a contact positioned at said contact end locator member, and
   means for actuating said crimping means.

2. The apparatus of claim 1 wherein said contact end locator includes first and second parts relatively movable between a first position within said crimping means and in which said contact end locator member blocks motion of a contact to said wire guiding path, and a second position retracted from said crimping means and in which said first and second parts are relatively displaced to permit withdrawal of a wire having a contact thereon through said wire guiding path.

3. The apparatus of claim 1 wherein said means for feeding a contact comprises pneumatic means for longitudinally driving a contact partly through said clamp means against said contact end locator member.

4. The apparatus of claim 1 wherein said clamp means comprises means for laterally pressing a contact to align the contact with said wire guiding path.

5. The apparatus of claim 1 including a contact end receiving seat formed on said contact end locator member, said seat having a configuration for matingly receiving a contact end, said clamp means being positioned to hold a contact on said seat.

6. The wire crimping apparatus of claim 1 wherein for feeding a contact comprises means for pneumatically urging said contact axially against said contact end locator member, and wherein said clamp means includes means for repetitively laterally aligning the contact with said seat and said wire guiding path.

7. The apparatus of claim 1 wherein said hollow clamp means comprises a collet positioned adjacent said crimping region and on the other side thereof, a contact guide tube connected with said collet, means for driving a contact through said guide tube to said collet, and means for repetitively actuating said collet to cause it to repetitively grasp and release a contact while the contact is being driven, whereby said contact may be precisely positioned in a selected abutting relation with said contact end locator member.

8. The apparatus of claim 5 wherein said contact end receiving seat is recessed into said contact end locator member and includes an aperture extending there through and forming a part of said wire guiding path.

9. The wire crimping apparatus of claim 1 including test means for determining presence in said crimping region of an acceptable, properly orientad contact.

10. The wire crimping apparatus of claim 9 wherein said test means comprises means for feeding a test probe along said wire guiding path to said crimping region.

11. The wire crimping apparatus of claim 1 including a contact sending station, a supply station, contact feeder means for feeding contacts from the supply station to the contact sending station, said contact sending station including means for transporting one contact at a time from said sending station to said crimping region.

12. The wire crimping apparatus of claim 1 including means for testing attachment of said contact to said wire end.

13. The wire crimping apparatus of claim 12 wherein said means for testing comprises a pull test station having first and second pairs of test jaws displacable from one another in a first direction, the jaws of said first pair being adapted to have a wire positioned therebetween, the jaws of said second pair being adapted to have positioned there between a contact on the end of a wire that is positioned between the jaws of said first pair, means for urging the jaws of each pair toward each other to respectively clamp a wire and its contact, and means operable while said jaws clamp a wire and its contact for urging said pairs away from one another in said first direction so as to exert a force tending to pull a contact clamped by the jaws of said second pair from a wire clamped by the jaws of said first pair.

14. The wire crimping apparatus of claim 11 wherein said contact sending station comprises a first block having first and second bores extending there through, a second block having a third bore extending there through, said blocks being pivoted to one another for motion between a first position in which said first and third bores are in alignment with one another and a second position in which said second and third bores are in alignment with one another, a pneumatic transport tube connected to and end of said third bore and having and end thereof connected with said clamp means, means for feeding a contact through said first bore into said third bore for guidance there through into said transport tube, means for shifting said blocks from said first position to said second position after a contact has passed from said first bore to said third bore, and means for pressurizing said second bore when said blocks are in said second position to pneumatically drive a contact in said third bore through said transport tube to said clamp means.

15. The crimping apparatus of claim 11 wherein said contact sending station comprises a sender body having a first passage exending there through, feeding means for introducing cpmtacts into said first passage, a pivot block having a second passage extending there through, said second passage having a first end adjacent said sender body and having a second end, a pressure tube, means for connecting said pivot block to said sender body for pivotal motion between a first position in which said first and second passages are in communication and alignment with one another to allow a contact to be passed from said first passage to said second passage, and a second position in which said first end of said second passage is connected to said pressure tube, and a transport tube connected the second end of said second passage for receiving a contact therefrom and transporting the contact to said clamp means, whereby said second passsage may be pressurized from said pressure tube when said pivot block is in said second position to drive a contact through said transport tube toward said clamp means.

16. The wire crimping apparatus of claim 15 including comprises a third passage in said sender body having a first end adapted to be connected to said pressure tube, and having a second end communicating and aligned with the first end of said second passage when said pivot block is in said second position, whereby pivotal motion of said pivot block to said second position couples said second passage to said pressure tube.

17. The wire crimping apparatus of claim 16 wherein said contact feeder means comprises a track, means for feeding a succession of contacts along said track, means fixed to said track for sensing passage of a first contact past a predetermined point of said track, and means responsive to said sensing meeans for retarding passage past said point of a contact following said first contact.

18. The wire crimping apparatus of claim 16 wherein said contact feed means comprises a contact container having a track along which contacts are passed, and having an upstanding wall adjacent a portion of said track, means for causing contacts to move along said track adjacent said wall, a separator body fixed to said container adjacent said wall, sensor means in said separator body for sensing passage of a first contact past a predetermined point on said track, air passage means formed in said separator body for projecting an air jet extending along an axis directed rearwardly along the path of contacts moving along said track, said air passage axis intersecting said path rearwardly of said predetermined point, means for selectively applying air under pressure to said air passage, and guide means connected to said body and having a guide entry adjacent said container wall for guiding contacts on said track into the path of an air jet projected from said passage.

19. The crimping apparatus of claim 1 wherein said means for feeding a contact through said clamp means comprises pneumatic means for urging a contact through said clamp means.

20. The wire crimping apparatus of claim 19 wherein said clamp means comprises a hollow collet and including means for causing said collet to repetitively grasp and release a contact positioned therein while said pneumatic means is actuated to urge a contact through said hollow collet to said contact member.

21. The wire crimping apparatus of claim 1 wherein said means for actuating said hollow clamp means comprises a hollow collet, a hollow piston slidably mounted on said collet and means for reciprocating the piston to repetitively actuate the collet.

22. A method of attaching a contact to the end of a wire comprising the steps of grasping a wire in a wire clamp with an end of the wire projecting from the clamp, moving the wire clamp and wire to a crimping station, positioning a contact having a wire receiving barrel at a predetermined position within a crimping region of said crimping station by moving said contact to a contact clamp in a first direction, actuating the contact clamp to secure said contact in said position at said crimping region, relatively moving said crimping station and secured contact longitudinally of said wire to insert the projecting end of the wire into the wire receiving barrel of the contact in a second direction opposite said first direction, and crimping said wire receiving barrel upon said wire end.

23. The method of claim 22 wherein said step of positioning a contact comprises forming a contact barrel receiving seat at a fixed position relative to said crimping station, positioning an end of said wire receiving barrel on said wire receiving seat, and operating said contact clamp to hold the end of said wire receiving barrel on said wire receiving seat, said step of relatively moving said crimping station and secured contact longitudinally of said wire comprising the step of moving said wire end through said barrel receiving seat.

24. The method of claim 23 including the step of forming said barrel receiving seat with relatively displaceable parts defining said barrel receiving seat within said crimping region and including the step of separating said relatively displaceable parts from one another and withdrawin said parts from said crimping region to enable the contact to be withdrawn with the wire through said barrel receiving seat.

25. The method of claim 22 including the step of performing a contact test in said crimping region prior to said step of relatively moving said crimping station and secured contact longitudinally of said wire.

26. The method of claim 25 wherein said step of performing a contact test includes the step of verifying presence in said crimping region of an acceptable properly oriented contact.

27. The method of claim 22 wherein said step of moving the clamp and wire includes transversely moving clamp and wire to align the wire said crimping region, and including the steps of longitudinally withdrawing said wire and a contact crimped thereon from said crimping region, transversely moving said wire and a contact crimped thereon relative to said crimping region, and testing the attachment of the contact to said wire end by pulling the contact longitudinally of said wire and relative to the wire.

28. The method of claim 27 wherein said step of pulling the contact comprises the steps of grasping the contact between a first set of test jaws, grasping a portion of the wire end displaced from said contact between a second set of test jaws, and exerting a force on said test jaw sets tending to displace said jaw sets relative to one another in a direction extending longitudinally of said wire.

29. The method of claim 22 including the steps of providing a supply of contacts, feeding contacts from said supply to a contact sending station, and transporting one contact at a time from said sending station to the crimping region of the crimping station.

30. The method of claim 29 wherein said step of feeding comprises temporarily disabling the feeding after a contact is fed to the sending station.

31. The method of claim 22 wherein said step of positioning comprises exerting longitudinal force on the contact to urge the contact toward said receiving seat, and operating said contact clamp to repetitively grasp and release the contact at the crimping region to align the contact with the receiving seat while it is urged toward the receiving seat.

32. Apparatus for automatically attaching a contact to a wire end comprising a support, a conveyor mounted on said said support, a crimping station positioned on said support adjacent said conveyor, and means on said conveyor for holding a wire extending transversely of said conveyor and for moving said wire along the conveyor to said crimping station, said crimping station comprising a crimping carriage mounted on said support for motion toward and away from said conveyor longitudinally of a wire carried thereby, a crimping arm mounted on said carriage and having a crimping region for receiving a contact to be attached to a wire end and for crimping a contact at said crimping region, a sending station on said support for transporting contacts one at a time to said crimping region, contact feeding means on said support for supplying contacts to said sending station, a contact and wire assembler on said crimping carriage having a contact end locator member positioned at a selected distance from and on one side of said crimping region, said contact assembler having a wire guiding path leading to said contact end locator member, means for driving said crimping carriage toward said conveyor to cause the end of a wire carried on said conveyor to move along said wire guiding path into a contact positioned at said contact end locator member, and means for actuating said crimping arm to crimp a contact positioned at said crimping region.

33. The apparatus of claim 32 including means adjacent said crimping region for receiving and securing a contact in abutment with said contact end locator member.

34. The apparatus of claim 33 wherein said means for receiving and securing comprises a longitudinally segmented collet having a bore for receiving a contact, and having an outwardly tapered exterior sirface. a hollow piston slideably mounted on said collet for reciprocating motion toward and away from said tapered exterior surface so as to cause said collet to grasp and release a contact in said bore, and a pneumatically pressurized transport tube connected between said collet bore and said sending station for pneumatically driving a contact to said collet bore.

35. The apparatus of claim 33 wherein said means for receiving and securing comprises a segmented collet having a bore for receiving a contact, wherein said sending station includes means for pneumatically driving a contact to said bore, and including means for actuating said collet to cause it to repetitively grasp and release a contact within said bore while the contact is pneumatically driven.

36. The apparatus of claim 32 wherein said contact end locator member comprises a contact receiving seat recessed therein and having a configuration for matingly receiving a contact end to precisely position a contact seated thereon both radially and longitudinally, said contact and wire assembler and said contact receiving seat comprising first and second parts relatively moveable between a first position in which said contact receiving seat blocks motion of a contact to said guiding wire path and a second position in which said first and second contact assembler parts are relatively displaced to permit withdrawal of a contact crimped to a wire through said contact receiving seat and through said wire guiding path.

37. The apparatus of claim 32 including a contact test probe mounted on said support for motion transversely of said wire guiding path between a first position in which the test probe is aligned with said wire guiding path and a second position in which the test probe is displaced from said wire guiding path, whereby motion of said crimping carriage toward said conveyor when the probe is positioned in said first position, moves the probe along the wire guiding path toward a contact in said crimping region to perform a contact test at said crimping region.

38. The apparatus of claim 32 including a test station mounted at a side of said conveyor adjacent said crimping station comprising first and second sets of test jaws, said first and second sets being displacable from one another along a line extending in a direction parallel to the length of a wire being carried by said conveyor, the jaws of said first set being positioned in the path of a contact on the end of a wire being carried by said conveyor, and the jaws of the second set being positioned in the path of an inner portion of a wire being carried by said conveyor, means for actuating said sets of jaws to cause them to grasp a contact and an inner portion of the wire respectively, and means for urging said sets of jaws away from one another to exert a pull test on the contact attached to said wire.

39. The wire crimping apparatus of claim 32 wherein said sending station comprises
a sender body having a first passage extending there through,
feeding means for introducing contacts to be transported into said first passage,
a pivot block having a second passage extending there through, said second passage having a first end adjacent said sender body and having a second end,
a pressure tube,
means for connecting said pivot block to said sender body for pivotal motion between a first position in which said first and second passages are in communication and alignment with one another to allow a contact to be passed from said first passage to said second passage, and a second position in which said first end of said second passage is connected to said pressure tube, and
a transport tube connected to the second end of said second passage for receiving a contact therefrom and transporting the contact to said crimping region
whereby said second passage is pressurized from said pressure tube when said pivot block is in said second position to drive a contact through said transport tube toward said crimping region.

40. Wire crimping apparatus comprising
crimping means having a crimping region for receiving a contact to be attached to a wire end and for crimping a contact at said wire region, and
contact locator and wire guide means connected to said crimping means, said contact locator and wire guide means comprising
a contact locator housing having a housing axis and having first and second inclined guide means extending toward said axis from opposite sides of said axis,
first and second contact locator elements slideably mounted to said guide means for motion along said axis and toward and away from each other and toward and away from said axis,
each said contact locator element having a contact locator member and a wire entry funnel member forming a part thereof,
said contact locator elements being movable along said guide means between a first position in which said elements are juxtaposed to one another with said contact locator members positioned in mutually mating relation to form a contact receiving seat adjacent said crimping region and to block passage of a contact from said seat to said entry funnel members, and with said wire entry funnel members positioned adjacent one another in mating relation to form a wire end receiving funnel aligned with said contact receiving seat, and a retracted position in which said contact locator elements are displaced from said crimping region and from each other to allow a contact to pass from said seat to said funnel, and
means for selectively driving said contact locator elements between said first and second positions.

41. The apparatus of claim 40 wherein said guide means comprise first and second slots extending through said contact locator housing and converging toward one another from an outer side of the housing to an inner side of the housing, each said contact locator element being slideably received in a respective one of said slots so as to move with components of motion along said housing axis and toward and away from said crimping region and said housing axis in moving between said first and second positions.

42. The crimping apparatus of claim 40 wherein said guide means comprise first and second T slots each having transversely positioned and longitudinally extending lateral guide channels and a longitudinally and radially extending central guide channel therebetween, and wherein each said contact locator element comprises a wedge-shaped body having longitudinally extending lateral flanges received in the guide channels of one of the T slots and having a central portion received in said central guide channel, inner surfaces of said central portions of the first and second contact locator elements being positioned in close face-to-face juxtaposition when said elements are in said first position.

43. The apparatus of claim 42 wherein said first and second central guide channels are laterally offset from one another to define guide shoulders for limiting motion of said wedge-shaped contact locator element bodies toward first position.

44. The apparatus of claim 40 wherein said means for selectively driving said contact locator elements comprise first second fluid cylinders mounted in said housing at opposite sides of said contact locator elements, said cylinders having axes extending in directions substantially parallel to the directions of said slots, first and second pistons in said cylinders, and means for connecting said pistons to said first and second contact locator elements.

45. Apparatus for testing the attachment of a contact to the end of a wire comprising
a fixed support,
a first pair of jaws mounted to said support for motion in a first direction toward and away from each other,
first drive means for selectively driving the jaws of said first pair toward or away from one another,
a movable support,
a second pair of jaws mounted to said movable support for motion toward and away from one another,
said movable support being mounted to said fixed support for motion of said second pair of jaws toward and away from said first pair of jaws,
second drive means for selectively driving the jaws of said second pair toward and away from one another, and
means for urging said movable support from a first position wherein the jaws of the second pair are juxtaposed to the jaws of the first pair, toward a second position in which the jaws of the second pair are displaced from the jaws of the first pair in a direction normal to said first direction, and loose contact sensing means for generating a loose contact signal in response to motion of the jaws of said second pair to said second position.

46. The apparatus of claim 45 wherein said first drive means comprises upper and lower stationary cylinders fixed to said fixed support and spaced therefrom in a direction normal to said first direction, first and second pistons mounted in said first and second stationary cylinders, the jaws of said first pair comprising first and second pincher pads carried by said first and second pistons, first and second tie-rods fixed to and extending respectively between said upper and lower stationary cylinders and said fixed support, said movable support being slideably mounted on said tie-rods for motion toward and away from said fixed support, said second drive means comprising first and second movable cylinders mounted on said movable support, third and fourth movable pistons mounted in said first and second movable cylinders for motion toward and away from each other, the jaws of said second pair comprising first and second pincher pads on said third and fourth movable pistons.a

* * * * *